US012051005B2

(12) United States Patent
Ronagh et al.

(10) Patent No.: US 12,051,005 B2
(45) Date of Patent: Jul. 30, 2024

(54) SYSTEM AND METHOD FOR ENABLING AN ACCESS TO A PHYSICS-INSPIRED COMPUTER AND TO A PHYSICS-INSPIRED COMPUTER SIMULATOR

(71) Applicant: 1QB INFORMATION TECHNOLOGIES INC., Vancouver (CA)

(72) Inventors: Pooya Ronagh, Vancouver (CA); Hao Ma, Vancouver (CA); Aleksandr Berezutskii, Waterloo (CA); Andrew Brendan Fursman, Vancouver (CA); Behrooz Sepehry, Vancouver (CA)

(73) Assignee: 1QB INFORMATION TECHNOLOGIES INC., Vancouver (CA)

( * ) Notice: Subject to any disclaimer, the term of this patent is extended or adjusted under 35 U.S.C. 154(b) by 531 days.

(21) Appl. No.: 17/110,729

(22) Filed: Dec. 3, 2020

(65) Prior Publication Data

US 2021/0166133 A1 Jun. 3, 2021

Related U.S. Application Data

(60) Provisional application No. 62/942,842, filed on Dec. 3, 2019.

(51) Int. Cl.
*G06N 3/10* (2006.01)
*G06F 9/30* (2018.01)
(Continued)

(52) U.S. Cl.
CPC .................. *G06N 3/10* (2013.01); *G06F 9/30* (2013.01); *G06F 9/455* (2013.01);
(Continued)

(58) Field of Classification Search
CPC ............ G06N 10/00; G06N 3/04; G06N 3/08; G06N 3/10; G06N 3/044; G06N 3/045;
(Continued)

(56) References Cited

U.S. PATENT DOCUMENTS

| 6,221,592 B1 | 4/2001 | Schwartz et al. |
| 7,113,967 B2 | 9/2006 | Cleve et al. |

(Continued)

FOREIGN PATENT DOCUMENTS

| CA | 2840958 A1 | 1/2013 |
| CA | 2881033 A1 | 4/2015 |

(Continued)

OTHER PUBLICATIONS

Zhu et al. ("Training of quantum circuits on a hybrid quantum computer", Science Advances, Research Article, Oct. 18, 2019, pp. 1-7) (Year: 2019).*

(Continued)

*Primary Examiner* — Shane D Woolwine
(74) *Attorney, Agent, or Firm* — Wilson Sonsini Goodrich & Rosati

(57) ABSTRACT

A computing system and a method are disclosed for enabling a processing device to remotely access a computing platform over a network, wherein the computing platform comprises at least one physics-inspired computer simulator comprising tunable parameters, the computing system comprising a communications interface configured to receive a request, wherein the request comprises at least one computational task to process using at least one physics-inspired computer simulator comprising tunable parameters; a control unit operatively connected to the communications interface and to the at least one physics-inspired computer simulator comprising tunable parameters, the control unit configured to translate the request into instructions for the at least one (Continued)

physics-inspired computer simulator deliver the instructions to the at least one physics-inspired computer simulator to perform the at least one computational task, receive at least one corresponding solution; and a memory operatively connected to the to the control unit and the at least one physics-inspired computer simulator, the memory being configured to store one or more of the at least one computational task, a dataset contained in the request, the tunable parameters of the at least one physics-inspired computer simulator, and the at least one corresponding solution.

24 Claims, 5 Drawing Sheets

(51) Int. Cl.
| | | |
|---|---|---|
| G06F 9/455 | (2018.01) | |
| G06F 30/27 | (2020.01) | |
| G06N 3/04 | (2023.01) | |
| G06N 3/044 | (2023.01) | |
| G06N 3/045 | (2023.01) | |
| G06N 3/08 | (2023.01) | |
| G06N 10/00 | (2022.01) | |
| G06N 10/20 | (2022.01) | |
| G06Q 90/00 | (2006.01) | |

(52) U.S. Cl.
CPC .......... *G06F 9/45504* (2013.01); *G06F 30/27* (2020.01); *G06N 3/04* (2013.01); *G06N 3/044* (2023.01); *G06N 3/045* (2023.01); *G06N 3/08* (2013.01); *G06N 10/00* (2019.01); *G06N 10/20* (2022.01); *G06Q 90/205* (2013.01)

(58) Field of Classification Search
CPC ........ G06N 10/20; G06N 20/00; G06N 20/10; G06N 20/20; G06F 9/30; G06F 9/455; G06F 9/45504; G06F 30/27; G06Q 90/205
See application file for complete search history.

(56) References Cited

U.S. PATENT DOCUMENTS

| | | | |
|---|---|---|---|
| 7,135,701 B2 | 11/2006 | Amin et al. | |
| 7,234,144 B2 | 6/2007 | Wilt et al. | |
| 7,418,283 B2 | 8/2008 | Amin et al. | |
| 7,533,068 B2 | 5/2009 | Maassen Van Den Brink et al. | |
| 7,619,437 B2 | 11/2009 | Thom et al. | |
| 7,639,035 B2 | 12/2009 | Berkley | |
| 7,660,533 B1 | 2/2010 | Meyers et al. | |
| 7,805,079 B1 | 9/2010 | Meyers et al. | |
| 7,877,333 B2 | 1/2011 | Macready | |
| 7,898,282 B2 | 3/2011 | Harris et al. | |
| 7,984,012 B2 | 7/2011 | Coury et al. | |
| 8,008,942 B2 | 8/2011 | Van Den Brink et al. | |
| 8,126,649 B2 | 2/2012 | Frasch et al. | |
| 8,175,995 B2 | 5/2012 | Amin | |
| 8,195,596 B2 | 6/2012 | Rose et al. | |
| 8,195,726 B2 | 6/2012 | Macready et al. | |
| 8,219,605 B2 | 7/2012 | Cowlishaw et al. | |
| 8,230,432 B2 | 7/2012 | Bryant et al. | |
| 8,244,504 B1 | 8/2012 | Jacobs | |
| 8,244,662 B2 | 8/2012 | Coury et al. | |
| 8,283,943 B2 | 10/2012 | Van Den Brink et al. | |
| 8,374,828 B1 | 2/2013 | Jacobs et al. | |
| 8,421,053 B2 | 4/2013 | Bunyk et al. | |
| 8,503,885 B2 | 8/2013 | Meyers et al. | |
| 8,655,828 B2 | 2/2014 | Rose | |
| 8,832,165 B2 | 9/2014 | Allen et al. | |
| 9,537,953 B1 | 1/2017 | Dadashikelayeh et al. | |
| 9,660,859 B1 | 5/2017 | Dadashikelayeh et al. | |
| 9,727,824 B2 | 8/2017 | Rose et al. | |
| 9,870,273 B2 | 1/2018 | Dadashikelayeh et al. | |
| 9,881,256 B2 | 1/2018 | Hamze et al. | |
| 10,044,638 B2 | 8/2018 | Dadashikelayeh et al. | |
| 10,152,358 B2 | 12/2018 | Dadashikelayeh et al. | |
| 10,223,084 B1 | 3/2019 | Dunn | |
| 10,325,218 B1* | 6/2019 | Zeng ..................... G06N 20/00 | |
| 10,339,466 B1 | 7/2019 | Ding et al. | |
| 10,346,748 B2 | 7/2019 | Aspuru-Guzik et al. | |
| 10,484,479 B2 | 11/2019 | Johnson et al. | |
| 10,558,932 B1 | 2/2020 | Neven et al. | |
| 10,614,370 B2 | 4/2020 | Johnson et al. | |
| 10,713,582 B2 | 7/2020 | Dadashikelayeh | |
| 10,824,478 B2 | 11/2020 | Dadashikelayeh et al. | |
| 10,826,845 B2 | 11/2020 | Dadashikelayeh et al. | |
| 10,929,294 B2 | 2/2021 | Brahm et al. | |
| 11,017,289 B2 | 5/2021 | Crawford et al. | |
| 11,196,775 B1 | 12/2021 | Badawy et al. | |
| 11,205,275 B2 | 12/2021 | Oami et al. | |
| 11,514,134 B2 | 11/2022 | Ronagh et al. | |
| 11,797,641 B2 | 10/2023 | Ronagh et al. | |
| 2003/0005068 A1 | 1/2003 | Nickel et al. | |
| 2003/0121028 A1 | 6/2003 | Coury et al. | |
| 2004/0254735 A1 | 12/2004 | Horn et al. | |
| 2004/0267916 A1 | 12/2004 | Chambliss et al. | |
| 2005/0027458 A1 | 2/2005 | Merz, Jr. et al. | |
| 2005/0182614 A1 | 8/2005 | Meredith | |
| 2005/0187844 A1 | 8/2005 | Chalermkraivuth et al. | |
| 2005/0250651 A1 | 11/2005 | Amin et al. | |
| 2005/0273306 A1 | 12/2005 | Hilton et al. | |
| 2006/0221978 A1 | 10/2006 | Venkatachalam | |
| 2006/0225165 A1 | 10/2006 | Maassen Van Den Brink et al. | |
| 2007/0177634 A1 | 8/2007 | Beausoleil et al. | |
| 2007/0180586 A1 | 8/2007 | Amin | |
| 2007/0215862 A1 | 9/2007 | Beausoleil et al. | |
| 2007/0239366 A1 | 10/2007 | Hilton et al. | |
| 2008/0059547 A1 | 3/2008 | Taylor | |
| 2008/0065573 A1 | 3/2008 | Macready | |
| 2008/0186918 A1 | 8/2008 | Tinnakornsrisuphap et al. | |
| 2008/0215850 A1 | 9/2008 | Berkley et al. | |
| 2008/0218519 A1 | 9/2008 | Coury et al. | |
| 2008/0262990 A1 | 10/2008 | Kapoor et al. | |
| 2008/0313430 A1 | 12/2008 | Bunyk | |
| 2009/0050357 A1 | 2/2009 | Suzuki | |
| 2009/0070402 A1 | 3/2009 | Rose et al. | |
| 2009/0078932 A1 | 3/2009 | Amin | |
| 2009/0164435 A1 | 6/2009 | Routt | |
| 2009/0182542 A9 | 7/2009 | Hilton et al. | |
| 2009/0306902 A1 | 12/2009 | Lemmen et al. | |
| 2009/0325694 A1 | 12/2009 | Beckman et al. | |
| 2010/0076913 A1 | 3/2010 | Yang et al. | |
| 2010/0261481 A1 | 10/2010 | Resende et al. | |
| 2010/0306142 A1 | 12/2010 | Amin | |
| 2011/0047201 A1 | 2/2011 | Macready et al. | |
| 2011/0231462 A1 | 9/2011 | Macready et al. | |
| 2011/0238378 A1 | 9/2011 | Allen et al. | |
| 2011/0238855 A1 | 9/2011 | Korsunsky et al. | |
| 2011/0296229 A1 | 12/2011 | Cowlishaw et al. | |
| 2012/0072579 A1 | 3/2012 | Teather | |
| 2012/0084242 A1 | 4/2012 | Levin | |
| 2012/0159506 A1 | 6/2012 | Barham et al. | |
| 2012/0215821 A1 | 8/2012 | Macready et al. | |
| 2012/0240185 A1 | 9/2012 | Kapoor et al. | |
| 2012/0253926 A1 | 10/2012 | Chen et al. | |
| 2012/0254586 A1 | 10/2012 | Amin et al. | |
| 2012/0278374 A1 | 11/2012 | Cowlishaw et al. | |
| 2012/0326720 A1 | 12/2012 | Gambetta et al. | |
| 2013/0026183 A1 | 1/2013 | Foster | |
| 2013/0144925 A1 | 6/2013 | Macready et al. | |
| 2013/0263131 A1 | 10/2013 | Beda, III et al. | |
| 2013/0308956 A1 | 11/2013 | Meyers et al. | |
| 2013/0336472 A1 | 12/2013 | Fahlgren et al. | |
| 2014/0025606 A1 | 1/2014 | Macready | |
| 2014/0067342 A1 | 3/2014 | Calderon | |
| 2014/0067808 A1 | 3/2014 | Narang et al. | |
| 2014/0122702 A1 | 5/2014 | Jung et al. | |
| 2014/0123325 A1 | 5/2014 | Jung et al. | |
| 2014/0187427 A1 | 7/2014 | Macready et al. | |
| 2014/0214257 A1 | 7/2014 | Williams et al. | |
| 2014/0250288 A1 | 9/2014 | Roy | |

(56) References Cited

U.S. PATENT DOCUMENTS

| | | |
|---|---|---|
| 2014/0258730 A1 | 9/2014 | Stecher |
| 2014/0324933 A1 | 10/2014 | Macready et al. |
| 2014/0337612 A1* | 11/2014 | Williams ............... G06N 10/00 713/100 |
| 2014/0344322 A1 | 11/2014 | Ranjbar |
| 2014/0379924 A1 | 12/2014 | Das et al. |
| 2015/0006443 A1 | 1/2015 | Rose et al. |
| 2015/0032991 A1 | 1/2015 | Lanting et al. |
| 2015/0032993 A1 | 1/2015 | Amin et al. |
| 2015/0055961 A1 | 2/2015 | Meyers et al. |
| 2015/0106413 A1 | 4/2015 | Ronagh |
| 2015/0111754 A1 | 4/2015 | Harris et al. |
| 2015/0120551 A1 | 4/2015 | Jung et al. |
| 2015/0120555 A1 | 4/2015 | Jung et al. |
| 2015/0142398 A1 | 5/2015 | Miller, III et al. |
| 2015/0169746 A1 | 6/2015 | Hatami-Hanza |
| 2015/0178349 A1 | 6/2015 | Niewodniczanski et al. |
| 2015/0193692 A1 | 7/2015 | Israel |
| 2015/0205759 A1 | 7/2015 | Israel et al. |
| 2015/0220852 A1 | 8/2015 | Hatami-Hanza |
| 2015/0227559 A1 | 8/2015 | Hatami-Hanza |
| 2015/0262074 A1 | 9/2015 | Bruestle et al. |
| 2015/0269124 A1 | 9/2015 | Hamze et al. |
| 2015/0269243 A1 | 9/2015 | Kobayashi |
| 2015/0332994 A1 | 11/2015 | Mallik et al. |
| 2015/0349960 A1 | 12/2015 | Bagley |
| 2015/0358251 A1 | 12/2015 | Varga et al. |
| 2015/0363358 A1 | 12/2015 | Ronagh et al. |
| 2015/0363708 A1 | 12/2015 | Amin et al. |
| 2016/0026183 A1 | 1/2016 | Williams et al. |
| 2016/0071021 A1 | 3/2016 | Raymond |
| 2016/0132785 A1 | 5/2016 | Amin et al. |
| 2016/0162798 A1 | 6/2016 | Marandi et al. |
| 2016/0171368 A1 | 6/2016 | Aspuru-Guzik et al. |
| 2016/0224515 A1 | 8/2016 | Ronagh et al. |
| 2016/0321559 A1 | 11/2016 | Rose et al. |
| 2016/0328253 A1 | 11/2016 | Majumdar |
| 2016/0328659 A1 | 11/2016 | Mohseni et al. |
| 2016/0338075 A1 | 11/2016 | Mckibben |
| 2016/0342891 A1 | 11/2016 | Ross et al. |
| 2017/0011305 A1 | 1/2017 | Williams |
| 2017/0017894 A1 | 1/2017 | Lanting et al. |
| 2017/0060642 A1 | 3/2017 | Castellano et al. |
| 2017/0109605 A1 | 4/2017 | Ahn |
| 2017/0147303 A1 | 5/2017 | Amy et al. |
| 2017/0147695 A1 | 5/2017 | Shih |
| 2017/0214701 A1 | 7/2017 | Hasan |
| 2017/0223143 A1 | 8/2017 | Johnson et al. |
| 2017/0242824 A1 | 8/2017 | Karimi et al. |
| 2017/0255592 A1 | 9/2017 | Karimi et al. |
| 2017/0255629 A1 | 9/2017 | Thom et al. |
| 2017/0255872 A1 | 9/2017 | Hamze et al. |
| 2017/0286852 A1 | 10/2017 | Rezaie et al. |
| 2017/0286858 A1 | 10/2017 | La et al. |
| 2017/0300808 A1 | 10/2017 | Ronagh et al. |
| 2017/0323195 A1 | 11/2017 | Crawford et al. |
| 2017/0344898 A1 | 11/2017 | Karimi et al. |
| 2017/0351974 A1 | 12/2017 | Rose et al. |
| 2017/0372427 A1 | 12/2017 | Johnson et al. |
| 2017/0373940 A1 | 12/2017 | Shahab et al. |
| 2018/0014970 A1 | 1/2018 | Conde De Paiva et al. |
| 2018/0039903 A1 | 2/2018 | Mosca et al. |
| 2018/0091440 A1 | 3/2018 | Dadashikelayeh et al. |
| 2018/0096085 A1 | 4/2018 | Rubin |
| 2018/0107526 A1 | 4/2018 | Dadashikelayeh et al. |
| 2018/0114138 A1 | 4/2018 | Monroe et al. |
| 2018/0204126 A1 | 7/2018 | Galle |
| 2018/0218279 A1 | 8/2018 | Lechner et al. |
| 2018/0218281 A1 | 8/2018 | Reinhardt et al. |
| 2018/0246851 A1 | 8/2018 | Zaribafiyan et al. |
| 2018/0260730 A1 | 9/2018 | Reagor et al. |
| 2018/0267937 A1 | 9/2018 | Pelc et al. |
| 2018/0308000 A1 | 10/2018 | Dukatz et al. |
| 2018/0308007 A1 | 10/2018 | Amin et al. |
| 2018/0314970 A1 | 11/2018 | Harris et al. |
| 2019/0009581 A1 | 1/2019 | Schalk et al. |
| 2019/0095811 A1 | 3/2019 | Antonio et al. |
| 2019/0205790 A1 | 7/2019 | Dukatz et al. |
| 2019/0251213 A1* | 8/2019 | Bishop ................... G06F 30/20 |
| 2019/0370680 A1 | 12/2019 | Novotny |
| 2019/0378047 A1 | 12/2019 | Pistoia et al. |
| 2020/0005186 A1 | 1/2020 | Romero et al. |
| 2020/0057957 A1 | 2/2020 | Johnson et al. |
| 2020/0090072 A1 | 3/2020 | Troyer et al. |
| 2020/0104740 A1 | 4/2020 | Cao |
| 2020/0125568 A1 | 4/2020 | Idicula et al. |
| 2020/0143910 A1 | 5/2020 | Noori et al. |
| 2020/0191943 A1 | 6/2020 | Wu et al. |
| 2020/0272683 A1 | 8/2020 | Ronagh et al. |
| 2020/0272684 A1 | 8/2020 | Karimi et al. |
| 2020/0279187 A1 | 9/2020 | Huang et al. |
| 2020/0364597 A1 | 11/2020 | Friedlander et al. |
| 2020/0364601 A1 | 11/2020 | Yamazaki et al. |
| 2020/0394537 A1 | 12/2020 | Wang et al. |
| 2020/0401920 A1* | 12/2020 | Killoran ................ G06N 20/00 |
| 2020/0410343 A1 | 12/2020 | Niu et al. |
| 2021/0103847 A1 | 4/2021 | Akzam |
| 2021/0166148 A1 | 6/2021 | Matsuura et al. |
| 2021/0279260 A1 | 9/2021 | Oberoi et al. |
| 2021/0287124 A1 | 9/2021 | Ronagh et al. |
| 2021/0289020 A1 | 9/2021 | Rolfe et al. |
| 2021/0374611 A1 | 12/2021 | Ronagh et al. |
| 2022/0107927 A1 | 4/2022 | Vedaie et al. |
| 2022/0366314 A1* | 11/2022 | Vall-Ilosera ........... G06N 20/10 |
| 2023/0077665 A1 | 3/2023 | Kuttimalai et al. |
| 2023/0104058 A1 | 4/2023 | Hopfmueller et al. |
| 2023/0259385 A1 | 8/2023 | Rosenberg et al. |
| 2023/0334115 A1 | 10/2023 | Yildiz et al. |

FOREIGN PATENT DOCUMENTS

| | | |
|---|---|---|
| CA | 2902015 A1 | 1/2016 |
| CA | 2921711 A1 | 8/2017 |
| CA | 3026824 A1 | 12/2017 |
| CN | 106874506 A | 6/2017 |
| CN | 110069348 A | 7/2019 |
| CN | 112034842 A | 12/2020 |
| EP | 3113084 A1 | 1/2017 |
| JP | 2004503011 A | 1/2004 |
| JP | 2006061926 A | 3/2006 |
| JP | 2008525873 A | 7/2008 |
| JP | 2013114366 A | 6/2013 |
| JP | 2016206795 A | 12/2016 |
| WO | WO-2005122052 A1 | 12/2005 |
| WO | WO-2006026985 A2 | 3/2006 |
| WO | WO-2007089674 A2 | 8/2007 |
| WO | WO-2007147243 A1 | 12/2007 |
| WO | WO-2010148120 A2 | 12/2010 |
| WO | WO-2013006836 A1 | 1/2013 |
| WO | WO-2014210368 A1 | 12/2014 |
| WO | WO-2015006494 A1 | 1/2015 |
| WO | WO-2015060915 A2 | 4/2015 |
| WO | WO-2015121619 A2 | 8/2015 |
| WO | WO-2016029172 A1 | 2/2016 |
| WO | WO-2017033326 A1 | 3/2017 |
| WO | WO-2017068228 A1 | 4/2017 |
| WO | WO-2017111937 A1 | 6/2017 |
| WO | WO-2017131081 A1 | 8/2017 |
| WO | WO-2017145086 A1 | 8/2017 |
| WO | WO-2017149491 A1 | 9/2017 |
| WO | WO-2017152289 A1 | 9/2017 |
| WO | WO-2017168865 A1 | 10/2017 |
| WO | WO-2017201626 A1 | 11/2017 |
| WO | WO-2017214717 A1 | 12/2017 |
| WO | WO-2018058061 A1 | 3/2018 |
| WO | WO-2018119522 A1 | 7/2018 |
| WO | WO-2018160599 A1 | 9/2018 |
| WO | WO-2019104440 A1 | 6/2019 |
| WO | WO-2019104443 A1 | 6/2019 |
| WO | WO-2019152020 A1 | 8/2019 |
| WO | WO-2019157228 A1 | 8/2019 |
| WO | WO-2019222748 A1 | 11/2019 |
| WO | WO-2019241879 A1 | 12/2019 |
| WO | WO-2019244105 A1 | 12/2019 |

(56) References Cited

FOREIGN PATENT DOCUMENTS

| WO | WO-2020113339 A1 | 6/2020 |
|---|---|---|
| WO | WO-2020223718 A1 | 11/2020 |
| WO | WO-2020227825 A1 | 11/2020 |
| WO | WO-2020255076 A1 | 12/2020 |
| WO | WO-2021055000 A1 | 3/2021 |
| WO | WO-2021111368 A1 | 6/2021 |
| WO | WO-2021181281 A1 | 9/2021 |
| WO | WO-2021207847 A1 | 10/2021 |
| WO | WO-2021237350 A1 | 12/2021 |
| WO | WO-2021243454 A1 | 12/2021 |
| WO | WO-2022079640 A1 | 4/2022 |
| WO | WO-2022123494 A1 | 6/2022 |
| WO | WO-2022224143 A1 | 10/2022 |
| WO | WO-2023275825 A1 | 1/2023 |
| WO | WO-2023053035 A1 | 4/2023 |
| WO | WO-2023242744 A1 | 12/2023 |

OTHER PUBLICATIONS

Mccaskey et al. ("Hybrid Programming for Near-term Quantum Computing Systems", 2018 IEEE International conference on rebooting computing (CRC), 2018, pp. 1-12) (Year: 2018).*

Etienne Membrives ("Machine-Learning for Optimization of Software Parameters," Technical Disclosure Commons, Defensive Publication Series, Dec. 7, 2017, pp. 1-35) (Year: 2017).*

Sarma et al. ("Quantum Unsupervised and Supervised Learning on Superconducting Processors", https://arxiv.org/abs/1909.04226, arXiv:1909.04226v1 [quant-ph] Sep. 10, 2019, pp. 1-6) (Year: 2019).*

Eidenbenz et al. ("Quantum Algorithm Implementations for Beginners", https://arxiv.org/abs/1804.03719, arXiv:1804.03719v1 [cs.ET], Apr. 10, 2018, pp. 1-75) (Year: 2018).*

Aggarwal et al.: Evolutionary network analysis: a survey. ACM Computing Surveys 47(1):10:1-10:36 (2014).

Akama et al. Implementation of divide-and-conquer method including Hartree-Fock exchange interaction. J Comput Chem 28(12):2003-2012 (2007).

Alidaee et al. Solving the maximum edge weight clique problem via unconstrained quadratic programming. European Journal of Operational Research 181(2):592-597 (2007).

Amelio et al.: Community mining in signed networks: a multiobjective approach. ASONAM 2013: Proceedings of the 2013 IEEE/ACM International Conference on Advances in Social Networks Analysis and Mining, pp. 95-99 https://doi.org/10.1145/2492517.2492641 (2013).

Amin et al.: Quantum Boltzmann Machine. arXiv reprint arXiv:1601.02036 [1-10] 2016.

Anchuri et al.: Communities and balance in signed networks: a spectral approach. In Proceedings of the 2012 International Conference on Advances in Social Networks Analysis and Mining (ASONAM 2012), ASONAM 2012, pp. 235-242, Washington, DC, USA (2012).

Anthony et al. Quadratization of symmetric pseudo-Boolean functions. Discrete Appl. Math. 203:1-12 (2016).

Aspuru-Guzik et al. Simulated Quantum Computation of Molecular Energies. Science 309:1704 (2005).

Assad et al. The quadratic minimum spanning tree problem. Naval Research Logistics 39:399-417(1992).

Babbush et al. Resource Efficient Gadgets for Compiling Adiabatic Quantum Optimization Problems. arXiv:1307.8041v1 [quant-ph] (pp. 1-11) (Jul. 2013) Retrieved from the Internet: (https://arxiv.org/pdf/1307.8041.pdf5).

Babbush. Towards Viable Quantum Computation for Chemistry, 2015, [Retrieved on Feb. 27, 2020]. Retrieved from the internet: <url: <a=""href="https://pdfs.sennanticscholar.org/aff0/5ecf5f58c2206c923b767d76bed7f43b2a66.pdf">https://pdfs.sennanticscholar.org/aff0/5ecf5f58c2206c923b767d76bed7f43b2a66.pdf? ga=2.2412147.276222377.1582743768639821531.1551220934 376 Pages (1376) (2015) .</url:>.

Barends et al. Digitized adiabatic quantum computing with a superconducting circuit. Nature 534(7606):222-226 (2016).

Bartak et al. Constraint Satisfaction Techniques for Planning and Scheduling Problems (Coplas-15), Jul. 6, 2015. Retrieved on Nov. 17, 2019 at https://www.cs.bgu.ac.il/-icapsl5/workshops/Proceedings%2000PLAS%202015.pdf (pp. 1-41) (2015).

Beasley. Integer programming solution methods. Available at URL: http://people.brunel.ac.uk/-mastjjb/jeb/natcor_ip_rest.pdf (20 pgs.) (2011).

Berry et al. Simulating Hamiltonian dynamics with a truncated Taylor series. Phys Rev Lett 114(9):090502 (2015).

Bertoni et al. Quantum logic gates based on coherent electron transport in quantum wires. Physical Review Letters 84(25):5912 (2000).

Bhagat et al.: Node Classification in Social Networks. arXiv:1101.3291v1 Social Network Data Analytics, pp. 115-148 (2011).

Bian et al. The Ising model: teaching an old problem new tricks. D-Wave Systems 2 (32 pgs.) (2010).

Bojchevski et al.: Deep Gaussian Embedding of Graphs: Unsupervised Inductive Learning via Ranking. arXiv.org, Cornell University, arXiv: 1707.03815v4 [stat.ML], pp. 1-13 (2018).

Boros et al. On quadratization of pseudo-Boolean functions. arXiv:1404.6538v1 [math.OC] (11 pgs.) (2014).

Boros et al. Pseudo-boolean optimization. Discrete Applied Mathematics 123(1):155-225 (2002).

Bravyi et al. Fermionic quantum computation. arXiv:quant-ph/0003137 (2000).

Bromley et al.: Applications of near-term photonic quantum computers: software and algorithms. Quantum Science and Technology 5:034010DOI:10.1088/2058-9565/ab8504 arXiv:1912.07634 [1-36] (2019).

Burell: An Introduction to Quantum Computing using Cavity QED concepts. arXiv preprint arXiv:1210.6512 (2012).

Byrnes et al. Macroscopic quantum computation using Bose-Einstein condensates. arXiv preprint quantum-ph/1103.5512 (2011).

Cai et al. A practical heuristic for finding graph minors.arXiv:1406.2741 [quant-ph] (16 pgs) (2014).

Cai et al.: A survey on network community detection based on evolutionary computation. International Journal of Bio-Inspired Computation 8(2):84-98 (2016).

Cao et al.: Advances in Knowledge Discovery and Data Mining. Springer International, pp. 82-95 (2015).

Carleo et al.: Constructing exact representations of quantum many-body systems with deep neural networks. Nat Commun. 9(1):5322, pp. 1-11 doi: 10.1038/s41467-018-07520-3 (2018).

Carleo et al.: Solving the quantum many-body problem with artificial neural networks. pre-print arXiv: 1606.02318 Science 355(6325):602-606 doi:10.1126/science.aag2302 (2016).

Carrasquilla et al.: Reconstructing quantum states with generative models. arXiv:1810.10584 Nature Machine Intelligence 1(3):155-161 arXiv:1810.10584 (2019).

Carrasquilla. Machine learning for quantum matter. https://arxiv.org/pdf/2003.11040.pdf (2020).

Chen et al.: Community Detection via Maximization of Modularity and Its Variants. IEEE Transactions on Computational Social Systems 1(1):46-65 DOI:10.1109/TCSS.2014.2307458 (2014).

Chen et al.: Epidemic spreading on networks with overlapping community structure. Physica A: Statistical Mechanics and its Applications 391(4):1848-1854 (2012).

Chiang et al.: Exploiting longer cycles for link prediction in signed networks. In Proceedings of the 20th ACM International Conference on Information and Knowledge Management, CIKM 2011, pp. 1157-1162, New York, NY, USA [1-6] (2011).

Choi. Minor-embedding in adiabatic quantum computation: I. the parameter setting problem. Quantum Information Processing 7(5):193-209 (2008).

Chowdhury et al.: Quantum algorithms for Gibbs sampling and hitting-time estimation. arXiv:1603.02940 Quant. Inf. Comp. 17(1-2):41-64 (2017).

Chuang et al.: Experimental implementation of fast quantum searching. Physical Review Letters 80(15):3408-3411 DOI:10.1103/PhysRevLett.80.3408 (1998).

(56) References Cited

OTHER PUBLICATIONS

Clarke et al. Superconducting quantum bits. Nature 453(7198):1031 (2008).
Conforti et al.: Integer Programming: Graduate Texts in Mathematics 271. Springer [1-466] (2014).
Conway et al. An FPGA-based instrumentation platform for use at deep cryogenic temperatures. arxiv.org/abs/1509.06809 (2015).
Cory et al. Nuclear magnetic resonance spectroscopy: an experimentally accessible paradigm for quantum computing. arXiv preprint quant-ph/97090 01(1997).
Cowtan et al. On the qubit routing problem. arXiv:1902.08091v2 (2019).
Cramer et al. Efficient quantum state tomography, Nature Communications 1:149 (2010).
Debnath et al.: Demonstration of a small programmable quantum computer with atomic qubits. arXiv: 1603.04512 Nature 536(7614):63-66 doi:10.1038/nature18648 (2016).
Deutsch et al. Quantum computing with neutral atoms in an optical lattice. arXiv preprint quant-ph/0003022 Fortschritte der Physik Progress of Physics; Oct. 2000, vol. 48, No. 9-11, pp. 925-943 (2000).
Durr et al. A Quantum Algorithm for Finding the Minimum. arXiv:quant-ph/9607014 (1996).
Dwave, Reverse Quantum Annealing for Local Refinement of Solutions, D-Wave Whitepaper Series, Nov. 9, 2017. Retrieved online on Aug. 14, 2019 from https://www.dwavesys.com/sites/default/files/14-1018A-A_Reverse_Quantum_Annealing_for_Local_Refinement_Of_Solutions.pdf (2 pgs.).
Elvira et al.: Efficient Multiple Importance Sampling Estimators. pre-print arxiv.org/pdf/1505.05391, pp. 1-7 (2015).
EP17812349.3 Third Party Observations dated Oct. 29, 2020.
Esmailian et al.: Mesoscopic analysis of online social networks: the role of negative ties. arXiv:1411.6057v1 Phys. Rev. E90:042817, pp. 1-13 (2014).
Farhi et al. A Quantum Approximate Optimization Algorithm. arXiv:1411.4028 (2014).
Farhi et al. Quantum Adiabatic Evolution Algorithms versus Simulated Annealing.arXiv.org:quant ph/0201031 pp. 1-16 (2002).
Farhi et al. Quantum computation by adiabatic evolution. arXiv preprint quant-ph/0001106 (24 pgs) (2000).
Fedichkin et al. Novel coherent quantum bit using spatial quantization levels in semiconductor quantum dot. arXiv preprint quant-ph/0006097 (2000).
Fedorov et al. Exploring chemistry with the fragment molecular orbital method. Physical Chemistry Chemical Physics 14:7562-7577 (2012).
Ferrara et al.: Detecting criminal organizations in mobile phone networks. arXiv:1404.1295v1 Expert Systems with Applications 41(13):5733-5750 (2014).
Fortunato: Community detection in graphs. arXiv.org, Cornell University, arXiv:0906.0612v1 [physics.soc-ph], pp. 1-89 (2009).
Freund. Applied Lagrange Duality for Constrained Optimization. Massachusetts Institute of Technology (pp. 1-35) (2004).
Gelman et al.: Simulating normalizing constants: from importance sampling to bridge sampling to path sampling. Statist. Sci. 13(2):163-185 DOI:10.1214/ss/1028905934 (1998).
Geoffrion. Lagrangean relaxation for integer programming. Mathematics Programming Study 2, North-Holland Publishing Company (pp. 1-34) (1974).
Glover et al. Polynomial unconstrained binary optimisation Part 1, 2011, [Retrieved on Feb. 27, 2020]. Retrieved from the internet: <url: <a=""href="http://leedsfaculty.colorado.edu/glover/fred%20pubs/424%20%20%20Polynonnial">http://leedsfaculty.colorado.edu/glover/fred%20pubs/424%20%20%20Polynonnial 25 Pages (231256) (2011) .</url:>.
Glover et al.: Tabu Search: Modern Heuristic Techniques for Combinatorial Problems. Colin R. Reeves (Ed.) Black Scientific Publications, Oxford [1-62] (1993).
Glover: Tabu search-part II. ORSA Journal on computing 2(1):4-32.1 4-32 DOI:10.1287/ijoc.2.1.4 (1990).

Greene et al. Simulated annealing without rejected moves. IEEE Transactions on Computer-Aided Design of Integrated Circuits and Systems 5(1):221-228 (1986).
Grover. a fast quantum mechanical algorithm for database search. Proceedings of the 28th Annual ACM Symposium on the Theory of Computing (pp. 212-219) (1996).
Gwennap: Groq Rocks Neural Networks. the Linley Group Microprocessor Report www.groq.com/groq-tsp-leads-in-inference-performance/ [1-5] (2020).
Hamilton et al.: Representation Learning on Graphs: Methods and Applications. arXiv.org, Cornell University, arXiv: 1709.05584v3 [cs.SI], pp. 1-24 (2018).
Harneit. Spin Quantum Computing with Endohedral Fullerenes. arXiv preprint arXiv:1708.092 98 (2017).
He et al.: MISAGA: an Algorithm for Mining Interesting Subgraphs in Attributed Graphs. IEEE Transactions on Cybernetics 48(5):1369-1382 (2018).
Heider: Attitudes and cognitive organization. The Journal of Psychology 21(1):107-112 (1946).
Huang et al.: Predicting many properties of a quantum system from very few measurements. Nature Physics 16(10)1050-1057 doi:arxiv.org/abs/2002.08953 [1-40](2020).
Hukushima et al. Exchange Monte Carlo Method and Application to Spin Glass Simulations. Journal of the Physical Society of Japan 65:1604 (1996).
Humble et al.: Software Systems for High-performance Quantum Computing. IEEE Xplore doi:10.1109/HPEC.2016.7761628 [1-8](2016).
Imamoglu et al.: Quantum information processing using quantum dot spins and cavity QED. Phys. Rev. Lett.; Nov. 1999, vol. 83, No. 20, pp. 4204-4207 http://134.34.147.128/burkard/sites/default/files/images/Imamoglu_Phys.%20Rev.%20Lett._199-01-01.pdf (1999).
Ishikawa. Transformation of General Binary MRF Minimization to the First-Order Case. IEEE Transactions on Pattern Analysis and Machine Intelligence. 33(6):1234-1249 (2011).
Izmaylov et al.: Revising the measurement process in the variational quantum eigensolver: is it possible to reduce the number of separately measured operators? Chem Sci. 10(13):3746-3755 (2019).
Johnson et al. Quantum annealing with manufactured spins. Nature 473(7346):194-198 (2011).
Jones et al.: Implementation of a quantum algorithm to solve Deutsch's problem on a nuclear magnetic resonance quantum computer. arXiv:quant-ph/9801027v2 the Journal of chemical physics, 109(5):1648-1653 DOI:10.1063/1.476739 (1998).
Jordan. Fast Quantum Algorithm for Numerical Gradient Estimation. Physical Review Letters 95:050501 (2015).
Kaminsky et al.: Scalable architecture for adiabatic quantum computing of NP-hard problems. Quantum Computing & Quantum Bits in Mesoscopic Systems, pp. 229-236 DOI: 10.1007/978-1-4419-9092-1_25 [arXiv:quant-ph/0211152 1-10] (2004).
Kane. A silicon-based nuclear spin quantum computer. Nature 393(6681):133 (1998).
Karimi et al. A subgradient approach for constrained binary programming via quantum adiabatic evolution. arXiv preprint arXiv: 1605.09462 (16 pgs.) (2016).
Karimi et al. Boosting quantum annealer performance via quantum persistence. Online publication eprint arXiv:1606.07797 (6/27/ 27 and updated Aug. 30, 2016). Accessed May 17, 2017 and available from https://www.arxiv.org/pdf/1606.07797.pdf (25 pgs).
Kassal et al.: Simulating chemistry using quantum computers. Annu Rev Phys Chem. 62:185-207 (2011).
Katzgraber et al. Seeking quantum speedup through spin glasses: the good, the bad, and the ugly. Physical Review 5(3):031026 (2015).
Kellerer et al. Knapsack Problems. Springer (15 pgs.) (2004).
Kempe et al.: The Complexity of the Local Hamiltonian Problem. SIAM Journal of Computing. 35(5):1070-1097 Rev.2008 DOI: arXiv:quant-ph/0406180v2 [1-30] (2005).
Kielpinski et al. Architecture for a large-scale ion-trap quantum computer. Nature 417(6890):709 (2002).
Kirkpatrick et al. Optimization by simulated annealing. Science 220:671-680 (1983).

(56) References Cited

OTHER PUBLICATIONS

Kitaura et al. Fragment molecular orbital method: an approximate computational method for large molecules. Chemical Physics Letters 313(3-4):701-706 (1999).

Knill et al. Efficient linear optics quantum computation. arXiv preprint quant-ph/0006088 (2000).

Knizia et al. Density Matrix Embedding: a Simple Alternative to Dynamical Mean-Field Theory. Phys Rev Lett 109:186404 (2012).

Kobayashi et al. Chapter 5: Divide-and-conquer approaches to quantum chemistry: Theory and implementation, in Linear-Scaling Techniques in Computational Chemistry and Physics: Methods and Applications, edited by Zalesny et al. (Springer Netherlands, Dordrecht, 2011) pp. 97-127.

Kochenberger et al.: The unconstrained binary quadratic programming problem: a survey. J Comb Optim. 28(1)58-81 DOI:10.1007/s10878-014-9734-0 (2014).

Kokail et al. Self-verifying variational quantum simulation of lattice models. Nature 569(7756):355-360 (2019).

Konda et al. Actor-Critic Algorithms. Advances in Neural Information Processing Systems. pp. 1008-1014 (2000).

Kunegis et al.: The slashdot zoo: Mining a social network with negative edges. In Proceedings of the 18th International 20 Conference on World Wide Web, WWW 2009, pp. 741-750, New York, NY, USA DOI: 10.1145/1526709.1526809 (2009).

Lemieux et al.: Efficient Quantum Walk Circuits for Metropolis-Hastings Algorithm. Quantum 4:287 [1-15] (2020).

Lemieux et al.: Resource estimate for quantum many-body ground-state preparation on a quantum computer. Physical Review A 103(5)052408 DOI: 10.1103/PhysRevA.103.052408 [1-9] (2021).

Lenstra: Integer programming with a fixed number of variables. 8(4):538-548 URL: https://doi.org/10.1287/moor.8.4.538 (1983).

Leskovec et al.: Empirical Comparison of Algorithms for Network Community Detection. Proceedings of International World Wide Web Conference 2010, Raleigh, North Carolina, USA, pp. 1-10 (2010).

Leskovec et al.: Predicting positive and negative links in online social networks. in Proceedings of the 19th International Conference on World Wide Web, WWW 2010, pp. 1-10, New York, NY, USA (2010).

Leuenberger et al. Quantum computing in molecular magnets. arXiv preprint cond- mat/0011415 (2001).

Levit et al. Free energy-based reinforcement learning using a quantum processor. Available at https://arxiv.org/pdf/1706.00074.pdf (May 2017) (8 pgs.).

Leyffer. Deterministic Methods for Mixed Integer Nonlinear Programming. University of Dundee (pp. 1-60 and pp. 1-58) (1993).

Li et al. Nonlinear Integer Programming. New York, NY (pp. 1-452) (2006).

Li: Tackling the Qubit Mapping Problem for NISQ-Era Quantum Devices. arXiv: 1809.02573v2 Proceedings of the Twenty-Fourth International Conference on Architectural Support for Programming Languages and Operating Systems. (2019).

Liben-Nowell et al.: The link prediction problem for social networks. in Proceedings of the Twelfth International Conference on Information and Knowledge Management, CIKM 2003, pp. 556-559, New York, NY, USA [1-19](2004).

Lin et al.: Understanding community effects on information diffusion. Advances in Knowledge Discovery and Data Mining, pp. 82-95 DOI:10.1007/978-3-319-18038-0_7 (2015).

Low et al.: Hamiltonian simulation by Qubitization. arXiv:1610.06546v3 Quantum 3:163 URL:https://doi.org/10.22331/q-2019-07-12-163 [1-23] (2019).

Lu et al.: Demonstration of Shor's quantum factoring algorithm using photonic qubits. arXiv:0705.1684v3 Physical Review Letters 99(25):250504 DOI:10.1103/PhysRevLett.99.250504 [1-5] (2007).

Lu et al.: KKT Solution and Conic Relaxation for Solving Quadratically Constrained Quadratic Programming Problem. SIAM J. Optim. 21(4):1475-1490 DOI:10.1137/100793955 (2011).

Lu et al., Quantum chemistry simulation on quantum computers: theories and experiments. Physical Chemistry Chemical Physics 14(26):9411-9420 (2012).

Lyon. Spin-based quantum computing using electrons on liquid helium. arXiv preprint cond-mat/030158 1 (2006).

Martinis et al. Rabi oscillations in a large Josephson-junction qubit. Physical Review Letters 89:117901 (2002).

Marx et al. Chapter 1. Setting the stage: why ab initio molecular dynamics? In Ab Initio Molecular Dynamics: Basic Theory and Advanced Methods. Cambridge, UK Cambridge University Press (pp. 1-8) (2009).

Massa et al.: Controversial users demand local trust metrics: an experimental study on Epinions.com community. In Proceedings of the 20th National Conference on Artificial Intelligence AAA Press vol. 1, AAAI-05:121-126 (2005).

Matsuura et al. VanQver: the Variational and Adiabatically Navigated Quantum Eigensolver. New Journal of Physics 22:053023 (2020).

McClean et al. The Theory of Variational Hybrid Quantum-Classical Algorithms, Institute of Physics. New Journal of Physics 18:023023. Retrieved online on Aug. 14, 2019 from https://iopscience.iop.org/article/10.1088/1367-2630/18/2/023023/ampdf(21 pgs)(2016).

McGeoch et al. Experimental Evaluation of an Adiabatic Quantum System for Combinatorial Optimization. Computing Frontiers. Proceeding CF '13 Proceedings of the ACM International Conference on Computing Frontiers. Article No. 23. Available athttp://www.cs.amherst.edu/ccm/cf14-mcgeoch.pdf (11 pgs) (May 14-16, 2013).

McKiernan et al. Automated quantum programming via reinforcement learning for combinatorial optimization. Quantum Physics. arXiv.org quant-ph arXiv:1908.08054 (2019).

Medus et al.: Detection of community structures in networks via global optimization. Physica A: Statistical Mechanics and its Applications 358(2-4):593-604 DOI: 10.1016/j.physa.2005.04.022 (2005).

Melko et al.: Restricted Boltzmann machines in quantum physics. Nature Physics 15(9):887-892 DOI:10.1038/s41567-019-0545-1 (2019).

Metz. IBM Is Now Letting Anyone Play With Its Quantum Computer. Wired. (5 pgs.) (May 2016).

Mnih et al. Asynchronous Methods for Deep Reinforcement Learning, in International Conference on Machine Learning, pp. 1928-1937 (2016).

Mnih et al. Playing Atari with Deep Reinforcement Learning. arXiv:1312.5602 (2013).

Moll et al., Optimizing qubit resources for quantum chemistry simulations in second quantization on quantum computer. Journal of Physics A: Mathematical and Theoretical 49(29):295301 (2016).

Moll et al.: Quantum optimization using variational algorithms on near-term quantum devices. Quantum Sci. Technol. 3 030503 [1-17] (2018).

Montanaro. Quantum walk speedup of backtracking algorithms. arXiv:1509.02374v2 [quant-ph] (23 pgs) (2015).

Monz et al.: Realization of a scalable Shor algorithm. arXiv: 1507.08852 Science 351(6277):1068-1070 DOI:10.1126/science.aad9480 (2015).

Motzkin et al.: Maxima for graphs as a new proof of a theorem of Turan. Canadian Journal of Mathematics 17:533-540 DOI:10.4153/CJM-1965-053-6 (1965).

Nafradi et al. Room temperature manipulation of long lifetime spins in metallic-like carbon nanospheres. Nat Commun 7:12232 (2016).

Nagy et al.: Variational quantum Monte Carlo method with a neural-network ansatz for open quantum systems. Phys Rev Letters 122(25):250501 doi:arxiv.org/abs/1902.09483 [1- 10](2019).

Nam et al.: Ground-state energy estimation of the water molecule on a trapped ion quantum computer. arXiv preprint arXiv:1902.10171, pp. 1-14 (2019).

Newman et al.: Finding and evaluating community structure in networks. Phys. Rev. E. 69:026113, pp. 1-16 (2004).

Newman: Modularity and community structure in networks. PNAS 103(23):8577-8582 (2006).

Niklasson et al., Fast method for quantum mechanical molecular dynamics. Physical Review B 86(17):174308 (2012).

Nishikawa et al. Quantum Chemistry Grid/Gaussian Portal, Journal of the twenty second Annual Research Society, Japan Simulation Society, Jun. 18, 2003, pp. 369 to 372 (English Abstract).

(56) References Cited

OTHER PUBLICATIONS

Nizovtsev et al. A quantum computer based on NV centers in diamond: optically detected nutations of single electron and nuclear spins. Optics and spectroscopy 99(2):233-244 (2005).
O'Gorman et al. Compiling planning into quantum optimization problems: a comparative study. Proc. of the Workshop on Constraint Satisfaction Techniques for Planning and Scheduling Problems (COPLAS-15) (pp. 11-20) (Jun. 2015) Retrieved from the Internet: <https://www.cs.bgu.acilt--icaps15/workshops/Proceedings%2000PLAS%202015.pdf>.
Ohlsson et al. Quantum computer hardware based on rare-earth-ion-doped inorganic crystals. Optics Communications 201(1-3):71-77 (2002).
Olsson et al.: Solving Large Scale Binary Quadratic Problems: Spectral Methods vs. Semidefinite Programming. IEEE Conference on Computer Vision and Pattern Recognition, pp. 1-8, doi:10.1109/CVPR.2007.383202 (2007).
O'Malley et al. Scalable Quantum Simulation of Molecular Energies. Phys. Rev. X 6:031007 (2016).
Orus. Tensor networks for complex quantum systems. Nature Reviews Physics 1:538 (2019).
PAPAMAKARIOS: Comparison of Modern Stochastic Optimization Algorithms. Scholar article. [1-13] (2014) www.richtarik.org/papers/Papamakarios.pdf.
PCT/CA2017/050320 International Search Report and Written Opinion dated Jun. 27, 2017.
PCT/CA2017/050637 International Search Report and Written Opinion dated Aug. 25, 2017.
PCT/CA2017/050709 International Search Report and Written Opinion dated Sep. 19, 2017.
PCT/CA2017/051610 International Search Report and Written Opinion dated Mar. 21, 2018.
PCT/CA2018/051531 International Search Report and Written Opinion dated Feb. 20, 2019.
PCT/CA2018/051534 International Search Report and Written Opinion dated Feb. 21, 2019.
PCT/CA2019/050852 International Search Report and Written Opinion dated Aug. 15, 2019.
PCT/CA2019/051752 International Search Report and Written Opinion dated Mar. 17, 2020.
PCT/CA2020/050641 International Search Report and Written Opinion dated Jul. 21, 2020.
PCT/CA2021/050513 International Search Report and Written Opinion dated Jul. 14, 2021.
PCT/CA2021/050709 International Search Report and Written Opinion dated Aug. 3, 2021.
PCT/CA2021/050750 International Search Report and Written Opinion dated Aug. 6, 2021.
PCT/IB2017/051038 International Search Report dated May 16, 2017.
PCT/IB2017/051224 International Search Report dated May 18, 2017.
PCT/IB2019/055226 International Search Report and Written Opinion dated Nov. 26, 2019.
PCT/IB2020/055801 International Search Report and Written Opinion dated Oct. 30, 2020.
PCT/IB2020/061464 International Search Report and Written Opinion dated Mar. 4, 2021.
PCT/IB2021/051965 International Search Report and Written Opinion dated May 31, 2021.
Peruzzo et al. A variational eigenvalue solver on a quantum processor. arXiv:1304.3061 (2013).
Pizzuti: a multi-objective genetic algorithm for community detection in networks. IEEE International Conference on Tools with Artificial Intelligence, pp. 379-386 DOI:10.1109/ICTAI.2009.58 (2009).
Poulin et al.: Sampling from the thermal quantum Gibbs state and evaluating partition functions with a quantum computer. arXiv:0905.2199 Physical Review Letters 103(22), pp. 1-7 DOI:10.1103/PhysRevLett.103.220502 (2009).
Preskill. Quantum Computing in the NISQ era and beyond. Quantum 2:79 arXiv:1801.00862 (2018).
Quek et al.: Adaptive Quantum State Tomography with Neural Networks. arXiv.org, Cornell University, arXiv:1812.06693v1 [quant-ph], pp. 1-13 pages (2018).
Reiher et al.: Elucidating reaction mechanisms on quantum computers. PNAS USA 114(29):7555-7560 (2017).
Ronagh et al. Solving constrained quadratic binary problems via quantum adiabatic evolution. arXiv preprint arXiv: 1509.05001 (20 pgs.) (2015).
Rosenberg et al. Building an iterative heuristic solver for a quantum annealer. Computational Optimization and Applications 65:845 (2016).
Rubin: a Hybrid Classical/Quantum Approach for Large-Scale Studies of Quantum Systems with Density Matrix Embedding Theory. Cornell University Library, Ithaca, NY arXiv doi:arxiv.org/abs/1610.06910 [1-10](2016).
Salathe et al.: Dynamics and control of diseases in networks with community structure. PLOS Computational Biology 6(4):e1000736, pp. 1-11 (2010).
Schmidt et al. General Atomic and Molecular Electronic Structure System. Journal of Computational Chemistry 14:1347-1363 (1993).
Schollwock. The density-matrix renormalization group. Review of Modern Physics 77:259 arxiv.org:cond-mat/0409292 (2004).
Schuld et al., "Quantum machine learning in feature Hilbert spaces", Phys. Rev. Lett.; Feb. 1, 2019, vol. 122, pp. 040504-1-12.
Schulman et al. Proximal Policy Optimization Algorithms. arXiv:1707.06347 (2017).
Schwabl: Quantum Mechanics. Springer, 4th Ed. [1-425] (2007).
Sepehry et al. Smooth Structured Prediction Using Quantum and Classical Gibbs Samplers. Available at https://1qbit.com/wp-content/uploads/2018/09/1QBit-Research-Paper-Smooth_Structured-Prediction-Using-Quantum-And_classical-Giobbs-Samplers.pdf (Accessed Feb. 20, 2018) (32 pgs).
Shapiro et al. a survey of Lagrangean techniques for discrete optimization. Operations Research Center, Massachusetts Institute of Technology, Cambridge, Massachusetts (pp. 1-18 and pp. 1-29) (May 1977).
Shen et al.: Quantum implementation of the unitary coupled cluster for simulating molecular electronic structure. Phys. Rev. A 95, 020501(R) doi:10.1103/PhysRevA.95.020501 [1-6] (2017).
Siraichi et al. Qubit Allocation. CGO 2018—International Symposium on Code Generation and Optimization, Feb. 2018, Vienna, Austria (12 pgs) (2018). pp.1-12.
Sloss et al. Evolutionary Algorithms Review, arXiv:1906.08870 (2019).
Srinivas et al.: Muiltiobjective optimization using non-dominated sorting in genetic algorithms. Evolutionary Computation 2(3):221-248 (1994).
Sun et al. a single-photon switch and transistor enabled by a solid-state quantum memory. arXiv preprint quant-ph/1805.01964 (2018).
Suzuki. Fractal decomposition of exponential operators with applications to many-body theories and Monte Carlo simulations. Physics Letters A 146(6):319-323 (1990).
Svore et al. Toward a Software Architecture for Quantum Computing Design Tools. QPL 2004, pp. 127-144, Retrieved from the Internet: URL:https://www.microsoft.com/en-us/research/wp-content/uploads/2016/02/10Svore-Cros s-Aho-Chuang-Markov.pdf.
SymPy Python. Internals of the Polynomial Manipulation Module. Available online at http://docs.sympy.org/latest/modules/polys/internals.html (Accessed Jun. 2016) (136 pgs).
Tang et al.: a Survey of Signed Network Mining in Social Media. ACM Computing Surveys 9(4): pp. 39:1 to 39:38, arXiv.org, Cornell University, arXiv:1511.07569v3 [cs.SI] (2016).
Tavares et al. New algorithms for Quadratic Unconstrained Binary Optimization (QUBO) with applications in engineering and social sciences. Rutgers University Community Repository. Dissertation—Retrieved from the Internet <URL: https://rucorelibrariessutgers.edu/rutgers-lib/25771/> on Feb. 2, 2018 (460 pgs) ( May 2008).
Temme et al.: Quantum metropolis sampling. Nature 471(7336):87-90 (2011).

(56) References Cited

OTHER PUBLICATIONS

Terhal et al.: the problem of equilibration and the computation of correlation functions on a quantum computer. arXiv:quant-ph/9810063 Phys.Rev. A61:22301, pp. 1-35 DOI:10.1103/PhysRevA.61.022301 (2000).
The D-Wave 2X™ Quantum Computer Technology Overview (12 pgs) (2015).
The D-Wave Quantum Computer. Brochure. D-Wave Systems Inc. 2016. www.dwavesys.com.
Torlai et al.: Neural-network quantum state tomography. pre-print arXiv:1703.05334v2 Nature Physics 14:447-450 DOI:10.1038/s41567-018-0048-5 (2017).
Tran et al. A hybrid quantum-classical approach to solving scheduling problems. AAAI Publications, Ninth Annual Symposium on Combinatorial Search. pp. 98-106 (SoCS 2016).
Tran et al. Explorations of Quantum-Classical Approaches to Scheduling a MarsLander Activity Problem. The Workshops of the Thirtieth AAAI Conference on Artificial Intelligence Planning for Hybrid Systems: Technical Report WS-16-12, p. 641-649, published on Mar. 29, 2016.
Trotter. On the product of semi-groups of operators. Proceedings of the American Mathematical Society 10(4):545-551 (1959).
U.S. Appl. No. 16/811,479 Non-Final Office Action dated Aug. 30, 2021.
U.S. Appl. No. 15/014,576 Office Action dated Dec. 26, 2017.
U.S. Appl. No. 15/014,576 Office Action dated Jul. 10, 2017.
U.S. Appl. No. 15/051,271 Office Action dated Mar. 13, 2018.
U.S. Appl. No. 15/051,271 Office Action dated Nov. 24, 2017.
U.S. Appl. No. 15/165,655 1st Action Interview dated Feb. 24, 2017.
U.S. Appl. No. 15/165,655 1st Action Interview dated Oct. 25, 2016.
U.S. Appl. No. 15/165,655 Office Action dated Jun. 2, 2017.
U.S. Appl. No. 15/486,960 Office Action dated Jun. 22, 2017.
U.S. Appl. No. 15/830,953 Office Action dated Feb. 14, 2018.
U.S. Appl. No. 15/831,967 Office Action dated Feb. 27, 2018.
U.S. Appl. No. 15/900,643 Miscellaneous Communication re: Third Party Submission dated Dec. 14, 2018.
U.S. Appl. No. 16/010,244 Miscellaneous Communication re: Third Party Submission dated Apr. 23, 2019.
U.S. Appl. No. 16/010,244 Office Action dated Dec. 2, 2019.
U.S. Appl. No. 16/010,244 Office Action dated Jun. 10, 2019.
U.S. Appl. No. 16/124,083 Miscellaneous Communication re: Third Party Submission dated Jul. 11, 2019.
U.S. Appl. No. 16/124,083 Office Action dated Jul. 18, 2019.
U.S. Appl. No. 16/124,083 Office Action dated Nov. 21, 2019.
U.S. Appl. No. 16/162,249 Miscellaneous Communication re: Third Party Submission dated May 2, 2019.
U.S. Appl. No. 16/162,249 Office Action dated Dec. 2, 2019.
U.S. Appl. No. 16/162,249 Office Action dated Jun. 12, 2019.
U.S. Appl. No. 16/888,446 3rd Party Submission dated Apr. 7, 2021.
Van Dam et al. How powerful is adiabatic quantum computation Proceedings 42nd IEEE Symposium on Foundations of Computer Science (pp. 279-287) (Oct. 2001).
Vartiainen: Unitary Transformations for Quantum Computing. Doctoral Dissertation. Helsinki University of Technology TKK dissertations. DOI: aaltodoc.aalto.fi/handle/123456789/2551 [1-56] (2005).
Veis et al.: Quantum computing applied to calculations of molecular energies: CH2 benchmark. J Chem Phys. 133(19):194106 doi:10.1063/1.3503767 [1-29](2010).
Venuti et al.: Adiabaticity in open quantum systems. arXiv: 1508.05558v2 Phys. Rev. A93(3):032118, pp. 1-12 DOI:10.1103/PhysRevA.93.032118 (2016).
Vinci et al. Quantum annealing correction with minor embedding. Physical Review A 92.4 (34 pgs) (Jul. 2015).
Wang et al. Population Annealing: Theory and Application in Spin Glasses. Physics Review E 92:961 (2015).
Waskiewicz: Friend of a friend influence in terrorist social networks. In Proceedings on the International Conference on Artificial Intelligence (ICAO, pp. 1-5. the Steering Committee of the World Congress in Computer Science, Computer Engineering and Applied Computing (WorldComp) (2012).
Wendin: Quantum information processing with superconducting circuits: a review. Rep Prog Phys. 80(10):106001 doi:10.1088/1361-6633/aa7e1a [1-50](2017).
White. Density Matrix Formulation for Quantum Renormalization Groups. Physical Review Letters 69:286 (1992).
Whitfield et al., Simulation of electronic structure Hamiltonians using quantum computers. Molecular Physics 109(5):735-750 (2011).
Wigner et al. Paulische equivalence ban. Magazine for physics 47:631 (1928) (English Abstract).
Wooters et al. The no-cloning theorem. Physics Today 62(2):76-77 (2009).
Wouters et al. a Practical Guide to Density Matrix Embedding Theory in Quantum Chemistry. J Chem Theory Comput. 12(6):2706-19 (2016).
Xu et al.: Neural network state estimation for full quantum state tomography. ArXiv preprint doi:arxiv.org/abs/1811.06654 [1-8] (2018).
Yang. Direct calculation of electron density in density-functional theory: Implementation for benzene and a tetrapeptide, Physical Review A 44:(11):7823-7826 (1991).
Zahedinejad et al.: Multi-Community Detection in Signed Graphs Using Quantum Hardware. arXiv.org, 1QBit online research paper, Cornell University, arXiv:1901.04873v1 [quant-ph], pp. 1-10 (2019).
Zimmerman et al. Strong Correlation in Incremental Full Configuration Interaction. Journal of Chemical Physics 146:224104 (2017).
Zulehner et al. Efficient mapping of quantum circuits to the IBM QX architectures. In Design, Automation & Test in Europe Conference & Exhibition 2018 38(7):1226-1236 (2018).
Aharonov, et al. Adiabatic quantum state generation and statistical zero knowledge. Proceedings of the thirty-fifth annual ACM symposium on Theory of computing. 2003. https://arxiv.org/abs/quant-ph/0301023.
An et al., "Quantum linear system solver based on time-optimal adiabatic quantum computing and quantum approximate optimization algorithm," 2019, arXiv preprint arXiv:1909.05500.
Boixo, et al., "Fast quantum algorithms for traversing paths of eigenstates," 2010, arXiv preprint arXiv:1005.3034, 36 pgs.
Boixo et al., "Quantum state preparation by phase randomization," 2009, arXiv preprint arXiv:0903.1652.
Bombin, et al. Topological quantum distillation. Phys Rev Lett. Nov. 3, 2006;97(18):180501. doi: 10.1103/PhysRevLett.97.180501. Epub Oct. 30, 2006.
Booth, K.E.C. et al., Comparing and Integrating Constraint Programming and Temporal Planning for Quantum Circuit Compilation, Twenty-Eighth International Conference on Automated Planning and Scheduling (ICAPS 2018), pp. 366-374 (2018).
Brassard, et al., "An exact quantum polynomial-time algorithm for Simon's problem," Proceedings of the Fifth Israeli Symposium on Theory of Computing and Systems, IEEE, 1997; 12 pgs.
Butenko, S., Maximum Independent Set and Related Problems, With Applications, a Dissertation Presented to the Graduate School of the University of Florida in Partial Fulfillment of the Requirements for the Degree of Doctor of Philosophy University of Florida, 167 pages (2003).
Chamberland et al, Triangular color codes on trivalent graphs with flag qubits. New J. Phys. Feb. 2020. vol. 22 023019. 24 pages. https://doi.org/10.1088/1367-2630/ab68fd.
Co-pending U.S. Appl. No. 18/189,390, inventors Dadashikelayeh; Majid et al., filed Mar. 24, 2023.
Das et al, a Scalable Decoder Micro-architecture for Fault-Tolerant Quantum Computing. arXiv preprint arXiv:2001.06598 (2020).
Delfosse et al, Almost-linear time decoding algorithm for topological codes. Quantum 5 (2021): 595.
Delfosse et al, Toward a Union-Find decoder for quantum LDPC codes. IEEE Transactions on Information Theory 68.5 (2022): 3187-3199.
Fan, et al. Robust Optimization of Graph Partitioning and Critical Node Detection in Analyzing Networks. in Combinatorial Optimization and Applications—4th International Conference, COCOA 2010, Proceedings (PART 1 ed., pp. 170-183). (Year: 2010).

(56) References Cited

OTHER PUBLICATIONS

Fan, et al. Robust optimization of graph partitioning involving interval uncertainty. Theoretical Computer Science. 447 (2012): 53-61.
Fowler, A.G. Minimum weight perfect matching in O (1) parallel time. arXiv 1307 (2013).
Gheorghiu, V. Standard form of qudit stabilizer groups. arXiv preprint arXiv:1101.1519 (2011).
Gibbons, L.E. et al., Continuous Characterizations of the Maximum Clique Problem, DIMACS Technical Report 96-09, Center for Applied Optimization Dept of Industrial and Systems Engineering University of Florida, Gainesville, FL 32611, 19 pages (Apr. 1996).
Gibbons, L.E. et al., Continuous Characterizations of the Maximum Clique Problem, Mathematics of Operational Research 22(3):754-768 (Aug. 1997).
Glover et al. Tabu Search. Handbook of Combinatorial Optimization, Du DZ., Pardalos P.M. (eds), Springer, Boston, MA, 1998; 94 pgs.
Gottesman, D. an Introduction to Quantum Error Correction and Fault-Tolerant Quantum Computation. arXiv preprint arXiv:0904.2557 (2009).
Han et al., "Approximate computing: an emerging paradigm for energy-efficient design," 18th IEEE European Test Symposium (ETS), IEEE, 2013; https://ieeexplore.ieee.org/document/6569370.
Hennessy, et al. Computer Architecture: a Quantitative Approach. Elsevier Science & Technology, 2014. ProQuest Ebook Central, https://ebookcentral.proquest.com/lib/uspto-ebooks/detail.action?docID=404052. (Year: 2014).
Herbert, S. et al., Using Reinforcement Learning to find Efficient Qubit Routing Policies for Deployment in Near-term Quantum Computers, arXiv:1812.11619, pp. 1-13 (Dec. 30, 2018).
Huang et al., Fault-tolerant weighted union-find decoding on the toric code. Physical Review A 102.1 (2020): 012419.
Imamoglu, et al. Quantum information processing using quantum dot spins and cavity-QED. arXiv preprint quant-ph/9904096 (1999).
Inagaki, T., Combinatorial optimization using optical oscillator networks, J-Stage 33(5):586-591 (2018).
Jiang, et al. Simulated annealing based influence maximization in social networks. Twenty-fifth AAAI conference on artificial intelligence (AAAI'11). AAAI Press, 127-132. (Year: 2011).
Kako, S. et al., Coherent Ising Machines with Error Correction Feedback, Advanced Quantum Technologies 3(2000045):14 pages (2020).
Karimi, et al. Practical integer-to-binary mapping for quantum annealers. Quantum Information Processing, vol. 18, No. 4, 94 (2019) DOI: 10.1007/s11128-019-2213-x.
Knill, et al. Resilient Quantum Computation: Error Models and Thresholds. Proceedings of the Royal Society of London. Series A: Mathematical, Physical and Engineering Sciences 454.1969 (1998): 365-384.
Krol et al., "Efficient decomposition of unitary matrices in quantum circuit compilers," 2021, arXiv preprint arXiv:2101.02993, 13 pgs.
Kubica et al., Efficient color code decoders in d=2 dimensions from toric code decoders. arXiv preprint arXiv:1905.07393 (2019).
Lamb, I.D.C. et al., An FPGA-based Instrumentation Platform for use at Deep Cryogenic Temperatures, arXiv: 1509.06809 [physics.ins-det]:1-8 (2015).
Lavnikevich, N., (1, k)-Swap Local Search for Maximum Clique Problem, arXiv:1704.00908 [math.OC], 14 pages, submitted on Apr. 4, 2017, abstract, 3 pages.
Mao, et al. Artificial neural networks for feature extraction and multivariate data projection. IEEE Transactions on Neural Networks. vol. 6, No. 2, pp. 296-317, Mar. 1995, doi: 10.1109/72.363467.
Matsubara, et al. Ising-Model Optimizer with Parallel-Trial Bit-Sieve Engine. Complex, Intelligent, and Software Intensive Systems: Proceedings of the 11th International Conference on Complex, Intelligent, and Software Intensive Systems (CISIS-2017), pp. 432-438, 2018.

Nielsen, et al. Quantum Computation and Quantum Information. Chapter 10: Quantum error-correction. Cambridge University Press. pp. 425-499. (2010).
Pardalos, P.M. et al., The Maximum Clique Problem, Journal of Global Optimization 4:301-328 (1994).
Parekh, et al. Benchmarking adiabatic quantum optimization for complex network analysis. arXiv preprint arXiv: 1604.00319 (2016). (Year: 2016).
PCT/IB2021/059421 International Search Report and Written Opinion dated Dec. 20, 2021.
PCT/IB2021/061527 International Search Report and Written Opinion dated Apr. 8, 2022.
PCT/IB2022/053658 International Search Report and Written Opinion dated Jun. 27, 2022.
PCT/IB2022/056124 International Search Report and Written Opinion dated Sep. 16, 2022.
PCT/IB2022/059253 International Search Report and Written Opinion dated Jan. 27, 2023.
PCT/IB2023/056105 International Search Report and Written Opinion dated Oct. 16, 2023.
PCT/IB2023/060066 International Search Report and Written Opinion dated Dec. 20, 2023.
Pedram, et al. Layout Optimization for Quantum Circuits with Linear Nearest Neighbor Architectures. IEEE Circuits and Systems Magazine 16 (2016): 62-74.
Pedregosa, F. Hyperparameter optimization with approximate gradient. International conference on machine learning. PMLR, 2016.
Pilch, J. et al., An FPGA-based real quantum computer emulator, Journal of Computational Electronics 18:329-342 (2019).
Pillutla, et al. A Smoother Way to Train Structured Prediction Models. NIPS'18: Proceedings of the 32nd International Conference on Neural Information Processing Systems. Dec. 3, 2018. doi:10.48550/arxiv.1902.03228 Retrieved from the Internet: https://dl.acm.org/doi/pdf/10.5555/3327345.3327386.
Rappe, et al. UFF, a Full Periodic Table Force Field for Molecular Mechanics and Molecular Dynamics Simulations. J. Am. Chem. Soc. 1992, 114, 25, 10024-10035. https://doi.org/10.1021/ja00051a040.
Resende, et al. GRASP with path-relinking: Recent advances and applications. Metaheuristics: progress as real problem solvers (2005): 29-63.
Sakaguchi, et al. Boltzmann Sampling by Degenerate Optical Parametric Oscillator Network for Structure-Based Virtual Screening. Entropy. 2016; 18(10):365. https://doi.org/10.3390/e18100365.
Sefi, et al. How to decompose arbitrary continuous-variable quantum operations. Physical review letters 107.17 (2011): 170501.
Sepehry, et al. Smooth Structured Prediction Using Quantum and Classical Gibbs Samplers. Oct. 1, 2018 (Oct. 1, 2018) Retrieved from the Internet: URL: https://arxiv.org/pdf/1809.04091v2.pdf [retrieved on Sep. 5, 2022].
Sinha, A. et al., Qubit Routing using Graph Neural Network aided Monte Carlo Tree Search, arXiv:2104:01992v1, pp. 1-10 (Apr. 1, 2021).
U.S. Appl. No. 15/900,643 Office Action dated Apr. 14, 2022.
U.S. Appl. No. 16/671,767 Office Action dated Aug. 30, 2022.
U.S. Appl. No. 16/811,479 Office Action dated Apr. 8, 2022.
U.S. Appl. No. 16/811,479 Office Action dated Feb. 14, 2023.
U.S. Appl. No. 16/811,479 Office Action dated Sep. 22, 2022.
U.S. Appl. No. 16/888,419 Office Action dated Aug. 24, 2023.
U.S. Appl. No. 16/888,419 Office Action dated Feb. 3, 2023.
U.S. Appl. No. 17/254,661 Office Action dated Mar. 18, 2022.
U.S. Appl. No. 17/254,661 Office Action dated Mar. 22, 2023.
U.S. Appl. No. 17/254,661 Office Action dated Sep. 14, 2022.
U.S. Appl. No. 17/254,661 Office Action dated Sep. 18, 2023.
U.S. Appl. No. 17/553,551 Notice of Allowance dated Dec. 1, 2023.
U.S. Appl. No. 17/553,551 Office Action dated Jul. 17, 2023.
U.S. Appl. No. 18/047,882 Notice of Allowance dated Jan. 18, 2024.
U.S. Appl. No. 18/047,882 Office Action dated Jul. 3, 2023.
U.S. Appl. No. 18/047,981 Corrected Notice of Allowance dated Aug. 18, 2023.
U.S. Appl. No. 18/047,981 Office Action dated Jan. 11, 2023.

(56) References Cited

OTHER PUBLICATIONS

Ushijima-Mwesigwa, et al. Graph Partitioning using Quantum Annealing on the D-Wave System. Proceedings of the Second International Workshop on Post Moores Era Supercomputing. 2017. (Year: 2017).
Wah, et al. Simulated Annealing with Asymptotic Convergence for Nonlinear Constrained Global Optimization. Principles and Practice of Constraint Programming—CP'99: 5th International Conference, CP'99, Alexandria, VA, USA, Oct. 11-14, 1999. Proceedings 5. Springer Berlin Heidelberg, 1999.
Wikipedia. Automatic Differentiation. Article from Nov. 23, 2016. https://en.wikipedia.org/w/index.php?title=Automatic_differentiation&oldid=751071969. Accessed Jan. 29, 2023. (Year: 2016).
Yanagimoto, et al. Engineering a Kerr-based Deterministic Cubic Phase Gate via Gaussian Operations. Physical Review Letters 124.24 (2020): 240503.
Bennewitz, Elizabeth R et al. Neural Error Mitigation of Near-Term Quantum Simulations. arXiv (with supplemental information): pp. 1-20 (2023).
Jia, Zhih-Ahn et al. Quantum Neural Network States. arXiv : pp. 1-18 (2018).
Torlai, Giacomo et al. Neural-network quantum state tomography. Nature Physics vol. 14,5: pp. 447-450 (2018).
Yang, Li et al. Deep learning-enhanced variational Monte Carlo method for quantum many-body physics vol. 2,1: pp. 1-6 (2020).
Bougrain, Practical Introductions to Artificial Neural Networks, IFAC Publications, vol. 37, No. 15, 347-352 (2003).
Häner et al., High Performance Emulation of Quantum Circuits, ArXiv.org, Cornell University Library, Apr. 21, 2016, 9 pages.

\* cited by examiner

SYSTEM AND METHOD FOR ENABLING AN ACCESS TO A PHYSICS-INSPIRED COMPUTER AND TO A PHYSICS-INSPIRED COMPUTER SIMULATOR

CROSS-REFERENCE TO RELATED APPLICATIONS

This application claims priority of U.S. provisional patent application No. 62/942,842 entitled "System and method for enabling a remote access to physics-inspired computational resources and simulation thereof" and that was filed on Dec. 3, 2019.

FIELD

One or more embodiments of the invention are directed towards a computing system and a method for providing a remote access to a computing platform over a network enabling a user to choose between using an actual physics-inspired computer and its simulator in one or more embodiments. In particular, one or more embodiments of the computing system enable a use of a physics-inspired computer simulator instead of the actual physics-inspired computer to reduce cost.

BACKGROUND

Nowadays the scientific community has come up with a whole bunch of different noisy intermediate-scale quantum (NISQ) devices as well as other physics-inspired devices and computers that are constantly being developed, improved and released. Despite being capable of performing optimization tasks, probabilistic sampling and/or other computational tasks with a significant speedup due to the variety of quantum and/or other physics phenomena behind them, access to these machines is still extremely expensive for users among such categories as research groups and startups. This situation is caused by several factors including high fabrication and maintenance cost.

Recognized herein is the need for at least one of a method and a system that will overcome at least one of the limitations associated with the access to such computers.

BRIEF SUMMARY

According to a broad aspect there is disclosed a computing system for enabling a processing device to remotely access a computing platform over a network, wherein the computing platform comprises at least one physics-inspired computer simulator comprising tunable parameters, the computing system comprising a communications interface for receiving a request provided by a processing device, wherein the request comprises at least one computational task to process using at least one physics-inspired computer simulator comprising tunable parameters; a control unit operatively connected to the communications interface and to the at least one physics-inspired computer simulator comprising tunable parameters, the control unit for translating the received request into instructions for the at least one physics-inspired computer simulator, for delivering the instructions to the at least one physics-inspired computer simulator to perform the at least one computational task and for receiving at least one corresponding solution; and a memory operatively connected to the control unit and to the at least one physics-inspired computer simulator, the memory for storing one or more of the at least one computational task, a dataset contained in the received request, the tunable parameters of the at least one physics-inspired computer simulator, and the received at least one corresponding solution.

In accordance with one or more embodiments, the computing platform further comprises at least one physics-inspired computer; the request further comprises a selection for at least one of the at least one physics-inspired computer simulator and the at least one physics-inspired computer; further wherein the control unit is further operatively connected to the at least one physics-inspired computer; the control Unit is further used for translating the received request into instructions for the at least one physics-inspired computer and for delivering the instructions to the at least one physics-inspired computer to perform the at least one computational task if said selection of said request is for the at least one physics-inspired computer; further wherein the control unit is further used for receiving, from the at least one physics-inspired computer, at least one corresponding solution.

In accordance with one or more embodiments, the computing system further comprises a training unit operatively connected to the at least one physics-inspired computer simulator, the training unit for training the at least one physics-inspired computer simulator.

In accordance with one or more embodiments the computing system further comprises a training unit operatively connected to the at least one physics-inspired computer simulator, the training unit for training the at least one physics-inspired computer simulator.

In accordance with one or more embodiments, the at least one physics-inspired computer simulator type corresponds to the physics-inspired computer; further wherein the training unit is used for training the at least one physics-inspired computer simulator using at least the instructions delivered to the physics-inspired computer and using at least one corresponding solution obtained from the physics-inspired computer.

In accordance with one or more embodiments, the communications interface receives a plurality of requests, further wherein the computing platform further comprises a queueing unit for queuing the received plurality of requests according to a criterion.

In accordance with one or more embodiments, the training unit trains the at least one physics-inspired computer simulator using the corresponding instructions delivered to the physics-inspired computer and the at least one corresponding solution obtained from the physics-inspired computer if a corresponding request comprises an indication that the at least one computational task and the at least one corresponding solution are useable for training purposes.

In accordance with one or more embodiments, the processing device remotely accessing the computing system comprises a digital computer operatively connected to the communications interface via a data network.

In accordance with one or more embodiments, the instructions for the physics-inspired computer and the instructions for the at least one physics-inspired computer simulator are identical.

In accordance with one or more embodiments, the computing platform comprises a distributed computing system.

In accordance with one or more embodiments, the physics-inspired computer comprises a non-classical computer.

In accordance with one or more embodiments, the non-classical computer is selected from a group consisting of a NISQ device, a quantum computer, a superconducting quantum computer, a trapped ion quantum computer, a quantum annealer, an optical quantum computer, a spin-based quantum dot computer and a photonics-based quantum computer.

In accordance with one or more embodiments, the at least one physics-inspired computer simulator comprises a computer-implemented method, the method comprising mimicking a physics-inspired computer output for a given input, and updating at least one of said tunable parameters using said training unit to thereby improve a corresponding performance.

In accordance with one or more embodiments, the training unit is selected from a group consisting of a tensor processing unit (TPU), a graphical processing unit (GPU), a field-programmable gate array (FPGA), and an application-specific integrated circuit (ASIC).

In accordance with one or more embodiments, the at least one physics-inspired computer simulator comprises a neural network.

According to a broad aspect, there is disclosed a computer-implemented method for enabling a remote access to a computing platform, wherein the computing platform comprises at least one physics-inspired computer simulator comprising tunable parameters, the method comprising receiving a request, at a communications interface, said request comprising at least one computational task to process using at least one physics-inspired computer simulator; translating said at least one computational task of said received request into instructions suitable for the at least one physics-inspired computer simulator; providing the instructions to the at least one physics-inspired computer simulator; receiving at least one corresponding generated solution resulting from an execution of the instructions; and providing the at least one corresponding generated solution.

In accordance with one or more embodiments, the computing system further comprises at least one physics-inspired computer and a training unit for training the at least one physics-inspired computer simulator; further wherein the received request further comprises an indication of a choice of at least one of the physics-inspired computer and the at least one physics-inspired computer simulator to use for processing the at least one computational task; further wherein said at least one computational task of said request is translated into instructions suitable for at least one of the physics-inspired computer and the at least one physics-inspired computer simulator and further wherein the providing of the instructions is performed at least one of said physics-inspired computer and said at least one physics-inspired computer simulator depending on the indication of a choice.

In accordance with one or more embodiments, the request is received from a digital computer operatively connected to the communications interface using a data network; further wherein the at least one corresponding generated solution is provided to the digital computer.

In accordance with one or more embodiments, the at least one corresponding generated solution is obtained from the at least one physics-inspired computer, further comprising training the at least one physics-inspired computer simulator using the at least one corresponding generated solution and the at least one computational task.

In accordance with one or more embodiments, the training is performed if the request comprises an indication that the at least one computational task and the at least one corresponding generated solution are useable for training purposes.

In accordance with one or more embodiments, the training comprises performing a procedure based on a machine learning protocol using the at least one corresponding generated solution and the at least one computational task; and updating the tunable parameters of the physics-inspired computer simulator accordingly.

In accordance with one or more embodiments, the method further comprises storing the instructions and the at least one corresponding generated solution.

An advantage of one or more embodiments of the method and the computing system disclosed herein is that they enable an access to a physics-inspired computer simulator trained using real computational tasks, such as a quantum device simulator, which is relatively cheaper than access to the quantum device.

Another advantage of one or more embodiments of the method and the computing system disclosed herein is that they enable to mimic a physics-inspired computer, such as a quantum computer.

Another advantage of one or more embodiments of the method and the computing system disclosed herein is that they enable the use of at least one computational task to improve the physics-inspired computer simulator.

BRIEF DESCRIPTION OF THE DRAWINGS

In order that one or more embodiments of the invention may be readily understood, one or more embodiments of the invention are illustrated by way of example in the accompanying drawings.

DETAILED DESCRIPTION

Figure 1:
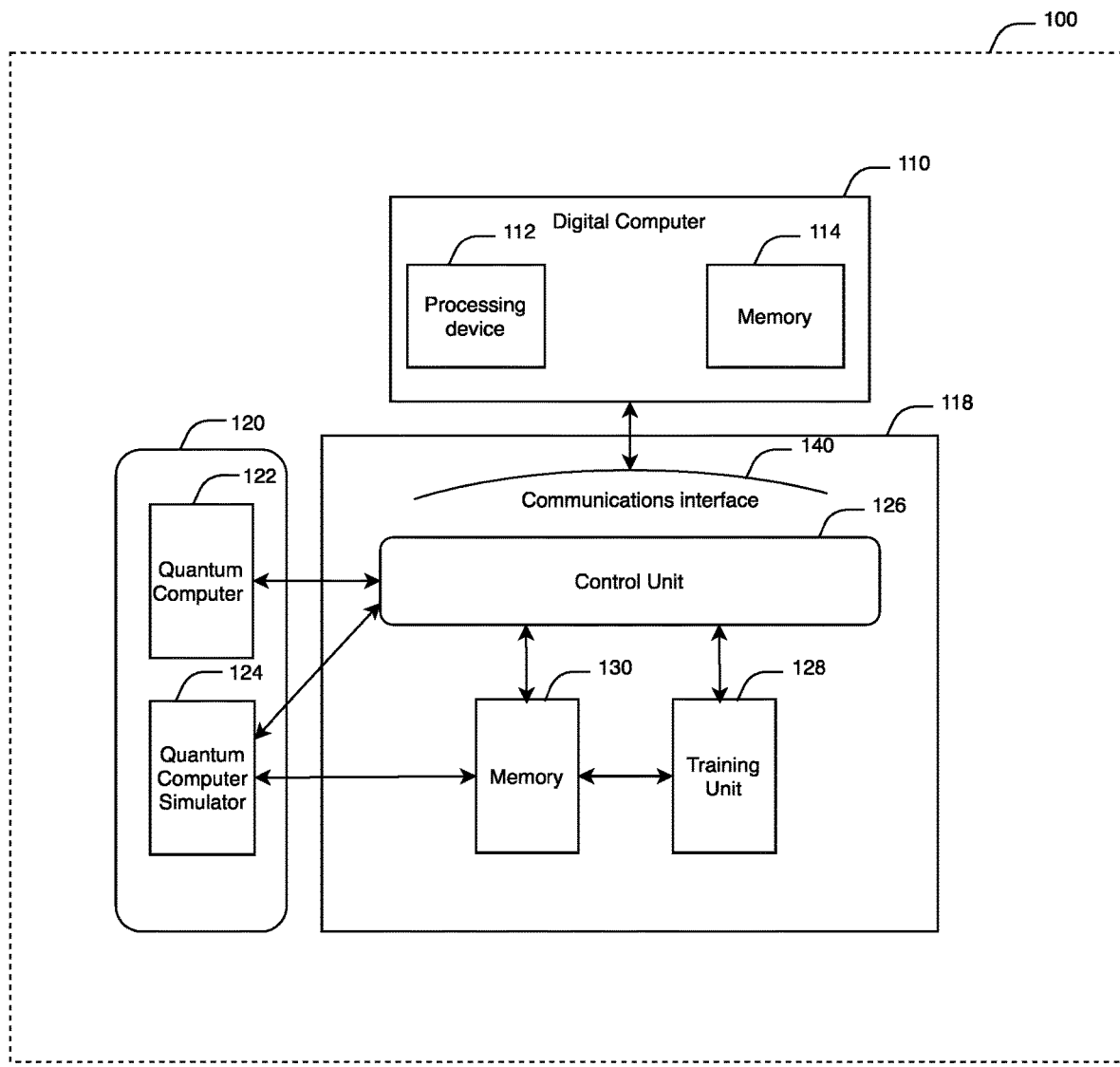
FIG. 1 is a diagram that shows an embodiment of a system for providing an access to a quantum computer and to a quantum computer simulator.

In the following description of the one or more embodiments, references to the accompanying drawings are by way of illustration of an example by which the invention may be practiced.

Terms

The term "invention" and the like mean "the one or more inventions disclosed in this application," unless expressly specified otherwise.

The terms "an aspect," "an embodiment," "embodiment," "embodiments," "the embodiment," "the embodiments," "one or more embodiments," "some embodiments," "certain embodiments," "one embodiment," "another embodiment" and the like mean "one or more (but not all) embodiments of the disclosed invention(s)," unless expressly specified otherwise.

A reference to "another embodiment" or "another aspect" in describing an embodiment does not imply that the referenced embodiment is mutually exclusive with another embodiment (e.g., an embodiment described before the referenced embodiment), unless expressly specified otherwise.

The terms "including," "comprising" and variations thereof mean "including but not limited to," unless expressly specified otherwise.

The terms "a," "an," "the" and "at least one" mean "one or more," unless expressly specified otherwise.

The term "plurality" means "two or more," unless expressly specified otherwise.

The term "herein" means "in the present application, including anything which may be incorporated by reference," unless expressly specified otherwise.

The term "whereby" is used herein only to precede a clause or other set of words that express only the intended result, objective or consequence of something that is previously and explicitly recited. Thus, when the term "whereby" is used in a claim, the clause or other words that the term "whereby" modifies do not establish specific further limitations of the claim or otherwise restricts the meaning or scope of the claim.

The term "e.g." and like terms mean "for example," and thus do not limit the terms or phrases they explain. For example, in a sentence "the computer sends data (e.g., instructions, a data structure) over the Internet," the term "e.g." explains that "instructions" are an example of "data" that the computer may send over the Internet, and also explains that "a data structure" is an example of "data" that the computer may send over the Internet. However, both "instructions" and "a data structure" are merely examples of "data," and other things besides "instructions" and "a data structure" can be "data."

The term "i.e." and like terms mean "that is," and thus limit the terms or phrases they explain.

Where values are described as ranges, it will be understood by the skilled addressee that such disclosure includes the disclosure of all possible sub-ranges within such ranges, as well as specific numerical values that fall within such ranges irrespective of whether a specific numerical value or specific sub-range is expressly stated.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be used, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As used herein, the term "classical," as used in the context of computing or computation, generally refers to computation performed using binary values using discrete bits without use of quantum mechanical superposition and quantum mechanical entanglement. A classical computer may be a digital computer, such as a computer employing discrete bits (e.g., 0's and 1's) without use of quantum mechanical superposition and quantum mechanical entanglement.

As used herein, the term "non-classical," as used in the context of computing or computation, generally refers to any method or system for performing computational procedures outside of the paradigm of classical computing.

As used herein, the term "physics-inspired," as used in the context of computing or computation, generally refers to any method or system for performing computational procedures which is based and/or mimics at least in part on any physics phenomenon.

As used herein, the term "quantum device" generally refers to any device or system to perform computations using any quantum mechanical phenomenon such as quantum mechanical superposition and quantum mechanical entanglement.

As used herein, the terms "quantum computation," "quantum procedure," "quantum operation," and "quantum computer" generally refer to any method or system for performing computations using quantum mechanical operations (such as unitary transformations or completely positive trace-preserving (CPTP) maps on quantum channels) on a Hilbert space represented by a quantum device.

As used herein, the term "quantum computer simulator" generally refers to any computer-implemented method using any classical hardware providing solutions to computational tasks mimicking the results provided by a quantum computer.

As used herein, the term "physics-inspired computer simulator" generally refers to any computer-implemented method using any classical hardware providing solutions to computational tasks mimicking the results provided by a physics-inspired computer.

As used herein, the term "Noisy Intermediate-Scale Quantum device" (NISQ) generally refers to any quantum device which is able to perform tasks which surpass the capabilities of today's classical digital computers.

The present disclosure discloses one or more embodiments of a method and a computing system for enabling an access to at least one of at least one physics-inspired computer and at least one physics-inspired computer simulator in a distributed computing environment.

Neither the Title nor the Abstract is to be taken as limiting in any way as the scope of the disclosed invention(s). The title of the present application and headings of sections provided in the present application are for convenience only, and are not to be taken as limiting the disclosure in any way.

Numerous embodiments are described in the present application, and are presented for illustrative purposes only. The described embodiments are not, and are not intended to be, limiting in any sense. The presently disclosed invention(s) are widely applicable to numerous embodiments, as is readily apparent from the disclosure. One of ordinary skill in the art will recognize that the disclosed invention(s) may be practiced with various modifications and alterations, such as structural and logical modifications. Although particular features of the disclosed invention(s) may be described with reference to one or more particular embodiments and/or drawings, it should be understood that such features are not limited to usage in the one or more particular embodiments or drawings with reference to which they are described, unless expressly specified otherwise.

It will be appreciated that one or more embodiments of the invention may be implemented in numerous ways. In this specification, these implementations, or any other form that the invention may take, may be referred to as systems or techniques. A component, such as a processing device or a memory described as being configured to perform a task, includes either a general component that is temporarily configured to perform the task at a given time or a specific component that is manufactured to perform the task.

With all this in mind, one or more embodiments of the present invention are directed to a method and a computing system for providing a remote access to a computing platform over a network wherein the computing platform comprises at least one physics-inspired computer simulator comprising tunable parameters.

One or more embodiments of the current invention enable an access to at least one of at least one physics-inspired computer and at least one physics-inspired computer simulator based on machine learning algorithms.

It will be appreciated that the physics-inspired computer simulator aims towards providing a cost-effective alternative to a quantum computer or other physics-inspired computers, enabling users to speed up the computations in comparison to the classical counterpart at a relatively lower price. In one or more embodiments, users have the option to choose between the physics-inspired computer and the physics-inspired computer simulator based on their requirements and submit their problems to the selected solver.

It will be appreciated that in one or more embodiments, the problems submitted are decoded to instructions suitable for the physics-inspired computer as further explained below. In one or more embodiments, these instructions are directed to either the physics-inspired computer or the physics-inspired computer simulator. Furthermore, if the instructions are directed to the actual physics-inspired computer, the submitted problem together with the results may be further used to improve the performance of the physics-inspired computer simulator using machine learning techniques.

For example, the quantum annealing simulator may comprise conditional generative models that are pre-trained with samples obtained from either any of the existing sampling algorithms such as Metropolis-Hasting Monte Carlo, or a real quantum device such as a quantum annealer. The conditional generative model may generate the corresponding data samples, which are further used to solve the original problem submitted by the user.

Physics-Inspired Computers

It will be appreciated that a physics-inspired computer may comprise one or more of an optical computing device such as an optical parametric oscillator (OPO) and integrated photonic coherent Ising machine, a quantum computer, such as a quantum annealer, or a gate model quantum computer, an implementation of a physics-inspired method, such as simulated annealing, simulated quantum annealing, population annealing, quantum Monte Carlo and alike.

Quantum Devices

Any type of quantum computers may be suitable for the technologies disclosed herein. In accordance with the description herein, suitable quantum computers may include, by way of non-limiting examples, superconducting quantum computers (qubits implemented as small superconducting circuits—Josephson junctions) (Clarke, John, and Frank K. Wilhelm. "Superconducting quantum bits." Nature 453.7198 (2008): 1031); trapped ion quantum computers (qubits implemented as states of trapped ions) (Kielpinski, David, Chris Monroe, and David J. Wineland. "Architecture for a large-scale ion-trap quantum computer." Nature 417.6890 (2002): 709.); optical lattice quantum computers (qubits implemented as states of neutral atoms trapped in an optical lattice) (Deutsch, Ivan H., Gavin K. Brennen, and Poul S. Jessen. "Quantum computing with neutral atoms in an optical lattice." arXiv preprint quant-ph/0003022 (2000)); spin-based quantum dot computers (qubits implemented as the spin states of trapped electrons) (Imamog, A., David D. Awschalom, Guido Burkard, David P. DiVincenzo, Daniel Loss, M. Sherwin, and A. Small. "Quantum information processing using quantum dot spins and cavity QED." arXiv preprint quant-ph/9904096 (1999)); spatial based quantum dot computers (qubits implemented as electron positions in a double quantum dot) (Fedichkin, Leonid, Maxim Yanchenko, and K. A. Valiev. "Novel coherent quantum bit using spatial quantization levels in semiconductor quantum dot." arXiv preprint quant-ph/0006097 (2000)); coupled quantum wires (qubits implemented as pairs of quantum wires coupled by quantum point contact) (Bertoni, A., Paolo Bordone, Rossella Brunetti, Carlo Jacoboni, and S. Reggiani. "Quantum logic gates based on coherent electron transport in quantum wires." Physical Review Letters 84, no. 25 (2000): 5912.); nuclear magnetic resonance quantum computers (qubits implemented as nuclear spins and probed by radio waves) (Cory, David G., Mark D. Price, and Timothy F. Havel. "Nuclear magnetic resonance spectroscopy: An experimentally accessible paradigm for quantum computing." arXiv preprint quant-ph/9709001 (1997)); solid-state NMR Kane quantum computers (qubits implemented as the nuclear spin states of phosphorus donors in silicon) (Kane, Bruce E. "A silicon-based nuclear spin quantum computer." nature 393, no. 6681 (1998): 133.); electrons-on-helium quantum computers (qubits implemented as electron spins) (Lyon, Stephen Aplin. "Spin-based quantum computing using electrons on liquid helium." arXiv preprint cond-mat/0301581 (2006)); cavity quantum electrodynamics-based quantum computers (qubits implemented as states of trapped atoms coupled to high-finesse cavities) (Burell, Zachary. "An Introduction to Quantum Computing using Cavity QED concepts." arXiv preprint arXiv:1210.6512 (2012).); molecular magnet-based quantum computers (qubits implemented as spin states) (Leuenberger, Michael N., and Daniel Loss. "Quantum computing in molecular magnets." arXiv preprint cond-mat/0011415 (2001)); fullerene-based ESR quantum computers (qubits implemented as electronic spins of atoms or molecules encased in fullerenes) (Harneit, Wolfgang. "Quantum Computing with Endohedral Fullerenes." arXiv preprint arXiv:1708.09298 (2017).); linear optical quantum computers (qubits implemented as processing states of different modes of light through linear optical elements such as mirrors, beam splitters and phase shifters) (Knill, E., R. Laflamme, and G. Milburn. "Efficient linear optics quantum computation." arXiv preprint quant-ph/0006088 (2000).); diamond-based quantum computers (qubits implemented as electronic or nuclear spins of nitrogen-vacancy centres in diamond) (Nizovtsev, A. P., S. Ya Kilin, F. Jelezko, T. Gaebal, lulian Popa, A. Gruber, and Jorg Wrachtrup. "A quantum computer based on NV centers in diamond: optically detected nutations of single electron and nuclear spins." Optics and spectroscopy 99, no. 2 (2005): 233-244.); Bose-Einstein condensate-based quantum computers (qubits implemented as two-component BECs) (Byrnes, Tim, Kai Wen, and Yoshihisa Yamamoto. "Macroscopic quantum computation using Bose-Einstein condensates." arXiv preprint quantum-ph/1103.5512 (2011)); transistor-based quantum computers (qubits implemented as semiconductors coupled to nano-photonic cavities) (Sun, Shuo, Hyochul Kim, Zhouchen Luo, Glenn S. Solomon, and Edo Waks. "A single-photon switch and transistor enabled by a solid-state quantum memory." arXiv preprint quant-ph/1805.01964 (2018)); rare-earth-metal-ion-doped inorganic crystal-based quantum computers (qubits implemented as atomic ground state hyperfine levels in rare-earth-ion-doped inorganic crystals) (Ohlsson, Nicklas, R. Krishna Mohan, and Stefan Kröll. "Quantum computer hardware based on rare-earth-ion-doped inorganic crystals." Optics communications 201, no. 1-3 (2002): 71-77.); metal-like carbon nanospheres based quantum computers (qubits implemented as electron spins in conducting carbon nanospheres) (Náfrádi, Bálint, Mohammad Choucair, Klaus-Peter Dinse, and László Forró. "Room temperature manipulation of long lifetime spins in metallic-like carbon nanospheres." arXiv preprint cond-mat/1611.07690 (2016)); and D-Wave's quantum annealers (qubits implemented as superconducting logic elements) (Johnson, Mark W., Mohammad HS Amin, Suzanne Gildert, Trevor Lanting, Firas Hamze, Neil Dickson, R. Harris et al. "Quantum annealing with manufactured spins." Nature 473, no. 7346 (2011): 194-198.).

NISQ—Noisy Intermediate-Scale Quantum Technology

The term Noisy Intermediate-Scale Quantum (NISQ) was introduced by John Preskill in "Quantum Computing in the NISQ era and beyond." arXiv:1801.00862. Here, "Noisy" implies that we have incomplete control over the qubits and the "Intermediate-Scale" refers to the number of qubits which could range from 50 to a few hundred. Several physical systems made from superconducting qubits, artificial atoms, ion traps are proposed so far as feasible candidates to build NISQ quantum device and ultimately universal quantum computers.

Quantum Annealer

A quantum annealer is a quantum mechanical system consisting of a plurality of manufactured qubits.

To each qubit is inductively coupled a source of bias called a local field bias. In one embodiment, a bias source is an electromagnetic device used to thread a magnetic flux through the qubit to provide control of the state of the qubit (see U.S. Patent Application No 2006/0225165).

The local field biases on the qubits are programmable and controllable. In one or more embodiments, a qubit control system comprising a digital processing unit is connected to the system of qubits and is capable of programming and tuning the local field biases on the qubits.

A quantum annealer may furthermore comprise a plurality of couplings between a plurality of pairs of the plurality of qubits. In one embodiment, a coupling between two qubits is a device in proximity of both qubits threading a magnetic flux to both qubits. In the same embodiment, a coupling may consist of a superconducting circuit interrupted by a compound Josephson junction. A magnetic flux may thread the compound Josephson junction and consequently thread a magnetic flux on both qubits (See U.S. Patent Application No. 2006/0225165). The strength of this magnetic flux contributes quadratically to the energies of the quantum Ising model with the transverse field. In one embodiment, the coupling strength is enforced by tuning the coupling device in proximity of both qubits.

The coupling strengths may be controllable and programmable. In one or more embodiments, a quantum annealer control system comprising a digital processing unit is connected to the plurality of couplings and is capable of programming the coupling strengths of the quantum annealer.

In one or more embodiments, the quantum annealer performs a transformation of the quantum Ising model with the transverse field from an initial setup to a final one. In such embodiments, the initial and final setups of the quantum Ising model with the transverse field provide quantum systems described by their corresponding initial and final Hamiltonians.

It will be appreciated that quantum annealers may be used as heuristic optimizers of their energy function. An embodiment of such an analog processor is disclosed by McGeoch, Catherine C. and Cong Wang, (2013), "Experimental Evaluation of an Adiabatic Quantum System for Combinatorial Optimization" Computing Frontiers," May 14 16, 2013 and is also disclosed in US Patent Application No. 2006/0225165.

It will be appreciated that quantum annealers may be further used for providing samples from the Boltzmann distribution of corresponding Ising model in a finite temperature. (Bian, Z., Chudak, F., Macready, W. G. and Rose, G. (2010), "The Ising model: teaching an old problem new tricks", and also Amin, M. H., Andriyash, E., Rolfe, J., Kulchytskyy, B., and Melko, R. (2016), "Quantum Boltzmann Machine" arXiv:1601.02036.) This method of sampling is called quantum sampling.

Optical Computing Devices

Another embodiment of an analogue system capable of performing sampling from Boltzmann distribution of an Ising model near its equilibrium state is an optical device.

In one or more embodiments, the optical device comprises a network of optical parametric oscillators (OPOs) as disclosed in US Patent Application No 2016/0162798 and in International Application WO2015006494 A1.

In this embodiment, each spin of the Ising model is simulated by an optical parametric oscillator (OPO) operating at degeneracy.

Degenerate optical parametric oscillators (OPO) are open dissipative systems that experience second-order phase transition at the oscillation threshold. Because of the phase-sensitive amplification, a degenerate optical parametric oscillator (OPO) could oscillate with a phase of either 0 or π with respect to the pump phase for amplitudes above the threshold. The phase is random, affected by the quantum noise associated with the optical parametric down conversion during the oscillation build-up. Therefore, a degenerate optical parametric oscillator (OPO) naturally represents a binary digit specified by its output phase. Based on this property, a degenerate optical parametric oscillator (OPO) system may be used as a physical representative of an Ising spin system. The phase of each degenerate optical parametric oscillator (OPO) is identified as an Ising spin, with its amplitude and phase determined by the strength and the sign of the Ising coupling between relevant spins.

When pumped by a strong source, a degenerate optical parametric oscillator (OPO) takes one of two phase states corresponding to spin +1 or −1 in the Ising model. A network of N substantially identical optical parametric oscillators (OPO) with mutual coupling are pumped with the same source to simulate an Ising spin system. After a transient period from the introduction of the pump, the network of optical parametric oscillators (OPO) approaches to a steady state close to its thermal equilibrium.

The phase state selection process depends on the vacuum fluctuations and mutual coupling of the optical parametric oscillators (OPO). In some implementations, the pump is pulsed at a constant amplitude, in other implementations the pump output is gradually increased, and in yet further implementations, the pump is controlled in other ways.

In one or more embodiments of an optical device, the plurality of couplings of the Ising model are simulated by a plurality of configurable couplings used for coupling the optical fields between optical parametric oscillators (OPO). The configurable couplings may be configured to be off or configured to be on. Turning the couplings on and off may be performed gradually or abruptly. When configured to be on, the configuration may provide any phase or amplitude depending on the coupling strengths of the Ising model.

Each optical parametric oscillator (OPO) output is interfered with a phase reference and the result is captured at a photodetector. The optical parametric oscillator (OPO) outputs represent a configuration of the Ising model. For example, a zero phase may represent a spin −1 state, and a π phase may represent a +1 spin state in the Ising model.

For the Ising model with spins, and according to one or more embodiments, a resonant cavity of the plurality of optical parametric oscillators (OPO) is configured to have a round-trip time equal to times the period of pulses from a pump source. Round-trip time as used herein indicates the time for light to propagate along one pass of a described recursive path. The pulses of a pulse train with period equal to the period of the resonator cavity round-trip time may propagate through the optical parametric oscillators (OPO) concurrently without interfering with each other.

In one or more embodiments, the couplings of the optical parametric oscillators (OPO) are provided by a plurality of delay lines allocated along the resonator cavity.

The plurality of delay lines comprise a plurality of modulators which synchronously control the strengths and phases of couplings, allowing for programming of the optical device to simulate the Ising model.

In a network of optical parametric oscillators (OPO), delay lines and corresponding modulators are enough to control amplitude and phase of coupling between every two optical parametric oscillators (OPO).

In one or more embodiments, an optimal device, capable of sampling from an Ising model can be manufactured as network of optical parametric oscillators (OPO) as disclosed in US Patent Application No. 2016/0162798.

In one or more embodiments, the network of optical parametric oscillators (OPO) and couplings of optical parametric oscillators (OPO) are achieved using commercially available mode locked lasers and optical elements, such as telecom fiber delay lines, modulators, and other optical devices. Alternatively, the network of optical parametric oscillators (OPO) and couplings of optical parametric oscillators (OPO) are implemented using optical fiber technologies, such as fiber technologies developed for telecommunications applications. It will be appreciated that the couplings may be realized with fibers and controlled by optical Kerr shutters.

Integrated Photonic Coherent Ising Machine.

Another embodiment of an analogue system capable of performing sampling from Boltzmann distribution of an Ising model near its equilibrium state is an Integrated photonic coherent Ising machine disclosed for instance in US Patent Application No. 2018/0267937A1.

In one or more embodiments, an Integrated photonic coherent Ising machine is a combination of nodes and a connection network solving a particular Ising problem. In such embodiments, the combination of nodes and the connection network may form an optical computer that is adiabatic. In other words, the combination of the nodes and the connection network may non-deterministically solve an Ising problem when the values stored in the nodes reach a steady state to minimize the energy of the nodes and the connection network. Values stored in the nodes at the minimum energy level may be associated with values that solve a particular Ising problem. The stochastic solutions may be used as samples from the Boltzmann distribution defined by the Hamiltonian corresponding to the Ising problem.

In such embodiments, a system comprises a plurality of ring resonator photonic nodes, wherein each one of the plurality of ring resonator photonic nodes stores a value; a pump coupled to each one of the plurality of ring resonator photonic nodes via a pump waveguide for providing energy to each one of the plurality of ring resonator photonic nodes; and a connection network comprising a plurality of two by two building block of elements, wherein each element of the two by two building block comprises a plurality of phase shifters for tuning the connection network with parameters associated with encoding of an Ising problem, wherein the connection network processes the value stored in the each one of the plurality of ring resonator photonic nodes, wherein the Ising problem is solved by the value stored in the each one of the plurality of ring resonator photonic nodes at a minimum energy level.

Digital Annealer

It will be appreciated that in one or more embodiments, the digital annealer refers to a digital annealing unit, such as those developed by Fujitsu™.

Algorithms Implemented Using Quantum Devices

It will be appreciated that any type of algorithms that can be implemented on quantum devices may be suitable for one or more embodiments of the method and the computing system disclosed herein. In accordance with the description herein, suitable algorithms may include, by way of non-limiting examples, Variational Quantum Eigensolver (VQE), which is a scalable co-design framework for solving chemistry problems on a quantum computers (Peruzzo, A., McClean, J., Shadbolt, P., Yung, M. H., Zhou, X. Q., Love, P. J., Aspuru-Guzik, A. and O'brien, J. L. (2014), "A variational eigenvalue solver on a photonic quantum processor". Nature communications, 5, p. 4213., arXiv: 1304.3061 and also Nam, Y., Chen, J. S., Pisenti, N. C., Wright, K., Delaney, C., Maslov, D., Brown, K. R., Allen, S., Amini, J. M., Apisdorf, J. and Beck, K. M. (2019), "Ground-state energy estimation of the water molecule on a trapped ion quantum computer". arXiv preprint arXiv:1902.10171.); Grover's algorithm, which is a quantum algorithm allowing quadratic speedup comparing to its classical counterparts for search tasks (Chuang, I. L., Gershenfeld, N. and Kubinec, M. (1998), "Experimental implementation of fast quantum searching". Physical review letters, 80(15), p. 3408.); Deutsch-Jozsa algorithm, which is an efficient quantum algorithm for solving the Deutsch-Jozsa problem (Jones, J. A. and Mosca, M. (1998), "Implementation of a quantum algorithm on a nuclear magnetic resonance quantum computer". The Journal of chemical physics, 109(5), pp. 1648-1653., arXiv:quant-ph/9801027 and also Debnath, S., Linke, N. M., Figgatt, C., Landsman, K. A., Wright, K. and Monroe, C. (2016). "Demonstration of a small programmable quantum computer with atomic qubits". Nature, 536(7614), p. 63., arXiv: 1603.04512); Shor's algorithm, which is a quantum algorithm for integer factorization allowing exponential speedup versus classical state-of-the-art factoring algorithms (Lu, C. Y., Browne, D. E., Yang, T. and Pan, J. W. (2007). "Demonstration of a compiled version of Shor's quantum factoring algorithm using photonic qubits". Physical Review Letters, 99(25), p. 250504., arXiv:0705.1684 and also Monz, T., Nigg, D., Martinez, E. A., Brandl, M. F., Schindler, P., Rines, R., Wang, S. X., Chuang, I. L. and Blatt, R. (2016). "Realization of a scalable Shor algorithm". Science, 351(6277), pp. 1068-1070., arXiv:1507.08852).

Physics-Inspired Computer Simulators

It will be appreciated that any type of simulators and simulations of physics-inspired computers may be suitable for one or more embodiments of the method and the computing system disclosed herein. It will be appreciated that the physics-inspired simulator may be any computer-implemented method using any classical hardware providing solutions to computational tasks mimicking the results provided by a physics-inspired computer. The physics-inspired simulator is based on an artificial intelligence method. The physics-inspired simulator may comprise for instance any machine learning method, such as a supervised machine learning method and unsupervised machine learning method, both of which may be combined with reinforcement learning method. The physics-inspired simulator may comprise any reinforcement learning method.

In one or more embodiments, a quantum computer simulator is represented by a stochastic framework in which reinforcement learning of parameters defining a generative machine learning model, particularly a Restricted Boltzmann Machine, is performed to obtain the neural network representation of the ground state and the time-dependent physical states of a given quantum Hamiltonian. The network weights are, in general, to be taken complex-valued to provide a complete description of both the amplitude and the phase of the wave-function. The parameters of the neural network are being optimized (trained, in the language of neural networks) either by static Variational Monte Carlo sampling or by time-dependent Variational Monte Carlo when dynamical properties are of interest. For details, see Carleo, G. and Troyer, M., 2017. Solving the quantum many-body problem with artificial neural networks. Science, 355(6325), pp. 602-606, arXiv:1606.02318 and Melko, R. G., Carleo, G., Carrasquilla, J. and Cirac, J. I. (2019). "Restricted Boltzmann machines in quantum physics". Nature Physics, 15(9), pp. 887-892, and also G. Torlai, G. Mazzola, J. Carrasquilla, M. Troyer, R. Melko and G. Carleo, (2018) "Neural-network quantum state tomography", Nature Physics 14, 447, arXiv:1703.05334.

In one or more other embodiments, a quantum computer simulator is represented by a Deep Boltzmann Machine. This setup proves being able representing the exact ground states of a large class of many-body lattice Hamiltonians. In such embodiments, two layers of hidden neurons mediate quantum correlations among physical degrees of freedom in the visible layer. The approach reproduces the exact imaginary-time Hamiltonian evolution and is completely deterministic. Compact and exact network representations for the ground states are obtained without stochastic optimization of the network parameters. Physical quantities may be measured by sampling configurations of both physical and neuron degrees of freedom. For details, see Carleo, G., Nomura, Y. and Imada, M. (2018). "Constructing exact representations of quantum many-body systems with deep neural networks". Nature communications, 9(1), p. 5322.

In one or more alternative embodiments, the quantum computer simulator comprises Recurrent Neural Networks (more precisely, the structure consisting of several stacked Gated Recurrent Units, or GRUs). Using this kind of scalable machine learning procedure makes it possible to reconstruct both pure and mixed states. It will be appreciated that the method is experimentally friendly as it requires only measurements of a quantum system. The learning procedure comes with a built-in approximate certificate of the reconstruction and makes no assumptions about the purity of the state under scrutiny. It can efficiently handle a broad class of complex systems including prototypical states in quantum information, as well as ground states of local spin models common to condensed matter physics. The procedure includes reducing state tomography to an unsupervised learning problem of the statistics of a quantum measurement. This constitutes a modern machine learning approach to the validation of complex quantum devices, which may in addition prove relevant as a neural-network Ansatz over mixed states suitable for variational optimization. For a detailed description, see Carrasquilla, J., Torlai, G., Melko, R. G. and Aolita, L. (2019). "Reconstructing quantum states with generative models". Nature Machine Intelligence, 1(3), p. 155, arXiv:1810.10584.

It will be appreciated that the quantum computer simulator may comprise generative model that is trained on quantum state tomography data. The generative model may comprise a neural networks representative of quantum states.

Neural networks may be used as functional representations of the wavefunction describing a quantum state. It will be appreciated by a skilled addressee that neural network quantum state tomography is one of the possible processes for training a neural network quantum state.

The skilled addressee will appreciate that Quantum state tomography (QST), the reconstruction of a quantum state using measurements, is the golden standard for verifying and benchmarking quantum devices (See M. Cramer, M. B. Plenio, S. T. Flammia, R. Somma, D. Gross, S. D. Bartlett, O. Landon-Cardinal, D. Poulin, and Y.-K. Liu, "Efficient quantum state tomography," Nature Communications 1 no. 1, (2010)). The number of measurements and time needed to exactly reconstruct a state using QST scales exponentially with system size. In neural network tomography, the wavefunction $|\psi\rangle$ is reconstructed from a set of measurements on the system. This strategy maps the learned probability distribution of a neural network to the probabilistic representation of a wavefunction.

Digital Computer

In one or more embodiments, the digital computer comprises one or more hardware central processing units (CPUs) that carry out the digital computer's functions. In one or more embodiments, the digital computer further comprises an operating system configured to perform executable instructions. In one or more embodiments, the digital computer is connected to a computer network. In one or more embodiments, the digital computer is connected to the Internet such that it accesses the World Wide Web. In one or more embodiments, the digital computer is connected to a cloud computing infrastructure. In one or more embodiments, the digital computer is connected to an intranet. In one or more embodiments, the digital computer is connected to a data storage device.

The skilled addressee will appreciate that various types of digital computer may be used. In fact, suitable digital computers may include, by way of non-limiting examples, server computers, desktop computers, laptop computers, notebook computers, sub-notebook computers, netbook computers, netbook computers, set-top computers, media streaming devices, handheld computers, Internet appliances, mobile smartphones, tablet computers, personal digital assistants, video game consoles, and vehicles. Smartphones may be suitable for use with one or more embodiments of the method and the system described herein. Select televisions, video players, and digital music players, in some cases with computer network connectivity, may be suitable for use in one or more embodiments of the system and the method described herein. Suitable tablet computers may include those with booklet, slate, and convertible configurations.

In one or more embodiments, the digital computer comprises an operating system configured to perform executable instructions. The operating system may be, for example, software, comprising programs and data, which manages the device's hardware and provides services for execution of applications. The skilled addressee will appreciate that various types of operating system may be used. In fact, suitable server operating systems include, by way of non-limiting examples, FreeBSD, OpenBSD, NetBSD®, Linux, Apple®

Mac OS X Server®, Oracle® Solaris®, Windows Server®, and Novell® NetWare®. Suitable personal computer operating systems may include, by way of non-limiting examples, Microsoft® Windows®, Apple® Mac OS X®, UNIX®, and UNIX-like operating systems such as GNU/Linux®. In one or more embodiments, the operating system is provided by cloud computing. Suitable mobile smart phone operating systems may include, by way of non-limiting examples, Nokia® Symbian® OS, Apple® iOS®, Research In Motion® BlackBerry OS®, Google® Android®, Microsoft® Windows Phone® OS, Microsoft® Windows Mobile® OS, Linux®, and Palm® WebOS®. Suitable media streaming device operating systems may include, by way of non-limiting examples, Apple TV®, Roku®, Boxee®, Google TV®, Google Chromecast®, Amazon Fire®, and Samsung® HomeSync®. Suitable video game console operating systems may include, by way of non-limiting examples, Sony® P53®, Sony® P54®, Microsoft® Xbox 360®, Microsoft Xbox One, Nintendo® Wii®, Nintendo® Wii U®, and Ouya®.

In one or more embodiments, the digital computer comprises a storage and/or memory device. The skilled addressee will appreciate that various types of storage and/or memory may be used in the digital computer. In one or more embodiments, the storage and/or memory device comprises one or more physical apparatuses used to store data or programs on a temporary or permanent basis. In one or more embodiments, the device comprises a volatile memory and requires power to maintain stored information. In one or more embodiments, the device comprises non-volatile memory and retains stored information when the digital computer is not powered. In one or more embodiments, the non-volatile memory comprises a flash memory. In one or more embodiments, the non-volatile memory comprises a dynamic random-access memory (DRAM). In one or more embodiments, the non-volatile memory comprises a ferroelectric random access memory (FRAM). In one or more embodiments, the non-volatile memory comprises a phase-change random access memory (PRAM). In one or more embodiments, the device comprises a storage device including, by way of non-limiting examples, CD-ROMs, DVDs, flash memory devices, magnetic disk drives, magnetic tapes drives, optical disk drives, and cloud computing based storage. In one or more embodiments, the storage and/or memory device comprises a combination of devices, such as those disclosed herein.

In one or more embodiments, the digital computer comprises a display used for providing visual information to a user. The skilled addressee will appreciate that various types of display may be used. In one or more embodiments, the display comprises a cathode ray tube (CRT). In one or more embodiments, the display comprises a liquid crystal display (LCD). In one or more embodiments, the display comprises a thin film transistor liquid crystal display (TFT-LCD). In one or more embodiments, the display comprises an organic light-emitting diode (OLED) display. In one or more embodiments, an OLED display comprises a passive-matrix OLED (PMOLED) or active-matrix OLED (AMOLED) display. In one or more embodiments, the display comprises a plasma display. In one or more embodiments, the display comprises a video projector. In one or more embodiments, the display comprises a combination of devices, such as those disclosed herein.

In one or more embodiments, the digital computer comprises an input device to receive information from a user. The skilled addressee will appreciate that various types of input devices may be used. In one or more embodiments, the input device comprises a keyboard. In one or more embodiments, the input device comprises a pointing device including, by way of non-limiting examples, a mouse, trackball, trackpad, joystick, game controller, or stylus. In one or more embodiments, the input device comprises a touch screen or a multi-touch screen. In one or more embodiments, the input device comprises a microphone to capture voice or other sound input. In one or more embodiments, the input device comprises a video camera or other sensor to capture motion or visual input. In one or more embodiments, the input device comprises a Kinect, Leap Motion, or the like. In one or more embodiments, the input device comprises a combination of devices, such as those disclosed herein.

Now referring to FIG. 1, there is shown an embodiment of a system 100 for providing an access to a quantum computer and to a quantum computer simulator.

The system 100 comprises a digital computer 110 comprising a processing device 112 and a memory 114 comprising a computer program executable by the processing device to generate, inter alia, a request. As mentioned above, it will be appreciated that the digital computer 110 may be of various types. While there is disclosed an embodiment wherein the request is generated by the digital computer 110, it will be appreciated that the request may be provided according to various alternative embodiments.

In the embodiment disclosed in FIG. 1, the system 100 further comprises a computing platform 120. The computing platform 120 comprises at least one physics-inspired computer simulator comprising tunable parameters and at least one optional physics-inspired computer. In one or more alternative embodiments, the computing platform 120 comprises at least one physics-inspired computer simulator.

The system 100 further comprises a computing system 118. More precisely, the computing system 118 comprises a communications interface 140, a control unit 126, an optional training unit 128 and a memory 130. The digital computer 110 is operatively connected to the computing system 118 via the communication interface 140 and using a data network, not shown.

It will be appreciated that the at least one optional physics-inspired computer of the computing platform may be of various types. For instance and in one or more embodiments, the at least one optional physics-inspired computer comprises a quantum computer 122. It will be appreciated by the skilled addressee that the quantum computer 122 is an embodiment of a non-classical computer.

It will be appreciated that the quantum computer 122 may be of various types. In fact, it will be appreciated that in one or more embodiments, the quantum computer 122 is selected from a group consisting of a NISQ device, a superconducting quantum computer, a trapped ion quantum computer, a quantum annealer, an optical quantum computer, a spin-based quantum dot computer and a photonics-based quantum computer.

In one or more embodiments, the at least one physics inspired computer simulator type corresponds to the optional physics-inspired computer.

In one or more embodiments, the at least one physics-inspired computer simulator comprises a quantum computer simulator 124. It will be appreciated by the skilled addressee that in one or more embodiments the physics-inspired computer simulator is pre-trained.

In one or more embodiments, the at least one quantum computer simulator 124 is represented by a stochastic framework and a reinforcement learning is used by the optional training unit 128 to improve parameters defining a generative machine learning model. In one or more embodiments, the generative machine learning model is a Restricted Boltzmann Machine. In another embodiment, the generative machine learning model is selected from a group consisting of a Deep Boltzmann Machine, a Feed Forward Neural Network and a Recurrent Neural Network. The network weights may be taking complex-values to provide a complete description of both the amplitude and the wavefunction's phase. In one or more embodiments, the parameters of the neural network are optimized using a static Variational Monte Carlo sampling. In another embodiment wherein dynamical properties are of interest; the parameters of the neural network are optimized using a time-dependent Variational Monte Carlo.

In one or more alternative embodiments, the quantum computer simulator is represented by a Deep Boltzmann Machine. In such embodiments, two layers of hidden neurons are used to mediate quantum correlations among physical degrees of freedom in the visible layer. It will be appreciated that such method reproduces the exact imaginary-time Hamiltonian evolution and is deterministic. No stochastic optimization of the network parameters is required for obtaining network representations for the ground states. It will be further appreciated that physical quantities may be measured by sampling configurations of both physical and neuron degrees of freedom.

In one or more alternative embodiments, the quantum computer simulator comprises Recurrent Neural Networks. More precisely, the quantum computer simulator comprises a structure consisting of several stacked Gated Recurrent Units or GRUs. Using this kind of scalable machine learning procedure makes it possible to reconstruct both pure and mixed states. The method comprises measurements of a quantum system. The learning procedure comprises a built-in approximate certificate of the reconstruction and makes no assumptions about the purity of the state under scrutiny. The learning procedure comprises reducing state tomography to an unsupervised learning problem of the statistics of a quantum measurement.

Still referring to FIG. 1, it will be appreciated that the computing system 118 comprises a communications interface 140 for receiving a request. It will be appreciated that the request is provided by a processing device. In one or more embodiments, the processing device is a digital computer. It will be further appreciated that the request may be provided according to various embodiments. In one or more embodiments, the request is provided by the processing device to the communications interface 140 via a data network.

It will be appreciated that the communications interface 140 may be implemented according to various embodiments. In one or more embodiments, the communications interface 140 is implemented using an application programming interface (API) gateway configured to enable a user to transmit computational tasks and receive computational solutions.

In one or more embodiments, the application programming interface (API) gateway is programmed or configured to authenticate a user of the computing system. In one of more embodiments, the application programming interface (API) gateway is programmed or configured to monitor system and data security. As an example, the application programming interface (API) gateway may use secure sockets layer (SSL) for encrypting requests and responses. In one of more embodiments, the application programming interface (API) gateway is programmed or configured to monitor data traffic.

The request comprises at least one computational task to process using at least one physics-inspired computer simulator.

It will be appreciated that in one or more embodiments the request further comprises an indication of a selection for at least one of the at least one optional physics-inspired computer and at least one physics-inspired computer simulator.

It will be appreciated that the at least one computational task may be of various types. In one or more embodiments, the at least one computational task comprises an optimization task. In one or more alternative embodiments, the at least one computational task comprises sampling from a probability distribution. In one or more alternative embodiments, the at least one computational task comprises any computational task selected from a group consisting of a database search, solving Deutsch-Jozsa problem, solving quantum chemistry-related problems and integer factorization.

It will be further appreciated that the request may further comprise, in one or more embodiments, an indication that the at least one computational task and the at least one corresponding solution are useable for training purposes in order to improve the at least one physics-inspired computer simulator.

Still referring to FIG. 1, the computing system 118 further comprises a memory 130. The memory 130 is operatively connected to the control unit 126 and the at least one physics-inspired computer simulator. The memory 130 is configured to store one or more of the at least one computational task. The memory 130 is further used for storing a dataset contained in the request and required for performing the at least one computational task. The memory 130 is further used for storing the tunable parameters of the at least one physics-inspired computer simulator. Finally, the memory 130 is also used for storing the received at least one corresponding solution.

In one or more embodiments wherein the request further comprises an indication of a selection for at least one of the at least one optional physics-inspired computer and at least one physics-inspired computer simulator for performing the computational task, the memory 130 is further used for storing the selection.

It will be appreciated that the memory 130 is operatively connected to the control unit 126 and to the at least one physics-inspired computer simulator. In one or more embodiments, the memory 130 is accessed by the control unit 126, the optional training unit 128 and the at least one physics-inspired computer simulator.

Moreover, it will be appreciated that the memory 130 may be of various types. For instance and in one or more embodiments, the memory 130 is comprised of a database. It will be appreciated by the skilled addressee that many types of databases may be suitable for storage and retrieval of data. In one or more embodiments, suitable databases comprise, by way of non-limiting examples, relational databases, non-relational databases, object oriented databases, object databases, entity-relationship model databases, associative databases, and XML databases. In one or more embodiments, the database is Internet-based. In one or more embodiments, the database is web-based. In one or more embodiments, the database is cloud computing-based (e.g., on the cloud). In other embodiments, the database is based on one or more local computer storage devices. In one or more embodiments, solutions to solved problems are maintained by the database. In one or more embodiments, data sent along with a request are stored in the database as well.

Still referring to FIG. 1, it will be appreciated that the computing system 118 further comprises the control unit 126. The control unit 126 is operatively connected to the communications interface 140, to the memory 130, to the optional training unit 128 and to the computing platform 120.

The control unit 126 is used for translating the at least one computational task contained in the received request into instructions for at least one of the at least one optional physics-inspired computer and the at least one physics-inspired computer simulator. Furthermore, it will be appreciated that the control unit 126 is further used for delivering the instructions to at least one of the at least one optional physics-inspired computer and the at least one physics-inspired computer simulator to perform the computational task.

The control unit 126 is further used for receiving at least one corresponding solution to the computational task from at least one of the at least one optional physics-inspired computer and the at least one physics-inspired computer simulator.

It will be appreciated that in one or more embodiments, the computing system 118 further comprises a training unit 128 operatively connected to the at least one physics-inspired computer simulator.

The optional training unit 128 is used for training the at least one physics-inspired computer simulator. It will be appreciated that in such embodiments, the control unit 126 is further used for delivering the instructions and the corresponding at least one solution to the optional training unit 128, if an indication is received that the at least one computational task and the at least one corresponding solution are useable for training purposes in order to improving the at least one physics-inspired computer simulator.

In one or more embodiments, the at least one physics-inspired computer simulator type corresponds to the physics-inspired computer and the training unit 128 is used for training the at least one physics-inspired computer simulator using at least the instructions delivered to the physics-inspired computer and using at least one corresponding solution obtained from the physics-inspired computer. It will be appreciated that in one or more embodiments, the instructions for the physics-inspired computer and the instructions for the at least one physics-inspired computer simulator are identical.

It will be further appreciated that in one or more embodiments, the at least one physics-inspired computer simulator comprises a computer-implemented method. The method comprises mimicking a physics-inspired computer output for a given input, and updating at least one of said tunable parameters using the training 128 unit to thereby improve a corresponding performance.

It will be appreciated that the optional training unit 128 may be of various types. In fact, it will be appreciated that the optional training unit 128 used for improving performance of the at least one physics-inspired computer simulator is, in one or more embodiments, a computer-implemented method which updates tunable parameters of the physics-inspired computer simulator using a method based on artificial intelligence.

In one or more embodiments, the optional training unit 128 comprises a neural network. It will be appreciated by the skilled addressee that the neural network may be of various types. In one or more embodiments, the neural network comprises a Restricted Boltzmann Machine. In one or more other embodiments, the neural network comprises a Deep Boltzmann Machine. In yet one or more other embodiments, the neural network comprises a Recurrent Neural Network. In an alternative embodiment, the neural network comprises a Feed Forward Neural Network. It will be appreciated that the tunable parameters may comprise neural network weights. In one or more embodiments, the training unit 128 comprises a function approximator. The tunable parameters may comprise function approximator parameters.

It will be appreciated by the skilled addressee that the training unit 128 may be implemented according to various embodiments. More precisely, the training unit 128 may comprise at least one of a tensor processing unit (TPU), a graphical processing unit (GPU), a field-programmable gate array (FPGA), and an application-specific integrated circuit (ASIC). The skilled addressee will appreciate that various alternative embodiments may be provided for implementing the training unit 128.

In one or more embodiments, the control unit 126 is programmed for generating a worker to perform a translation of the computational task into instructions for at least one of the optional physics-inspired computer and the physics-inspired computer simulator. In such embodiments, the generated worker delivers the instructions to at least one of the at least one optional physics-inspired computer and the at least one physics-inspired computer simulator in accordance with a selection for performing the computational task. Furthermore and in this embodiment, the generated worker receives at least one corresponding solution and delivers the instructions and the at least one corresponding solution to the optional training unit 128.

It will be appreciated that the computing system 118 may further comprise an optional queuing unit, also referred to as a central queue and not shown in FIG. 1, in one or more embodiments. Such optional queuing unit is programmed for queuing a received plurality of requests according to a criterion. It will be appreciated that in one or more embodiments, a given request is placed in a queue in order to maintain an order of the request in the queue and prevent message lost.

Figure 2:
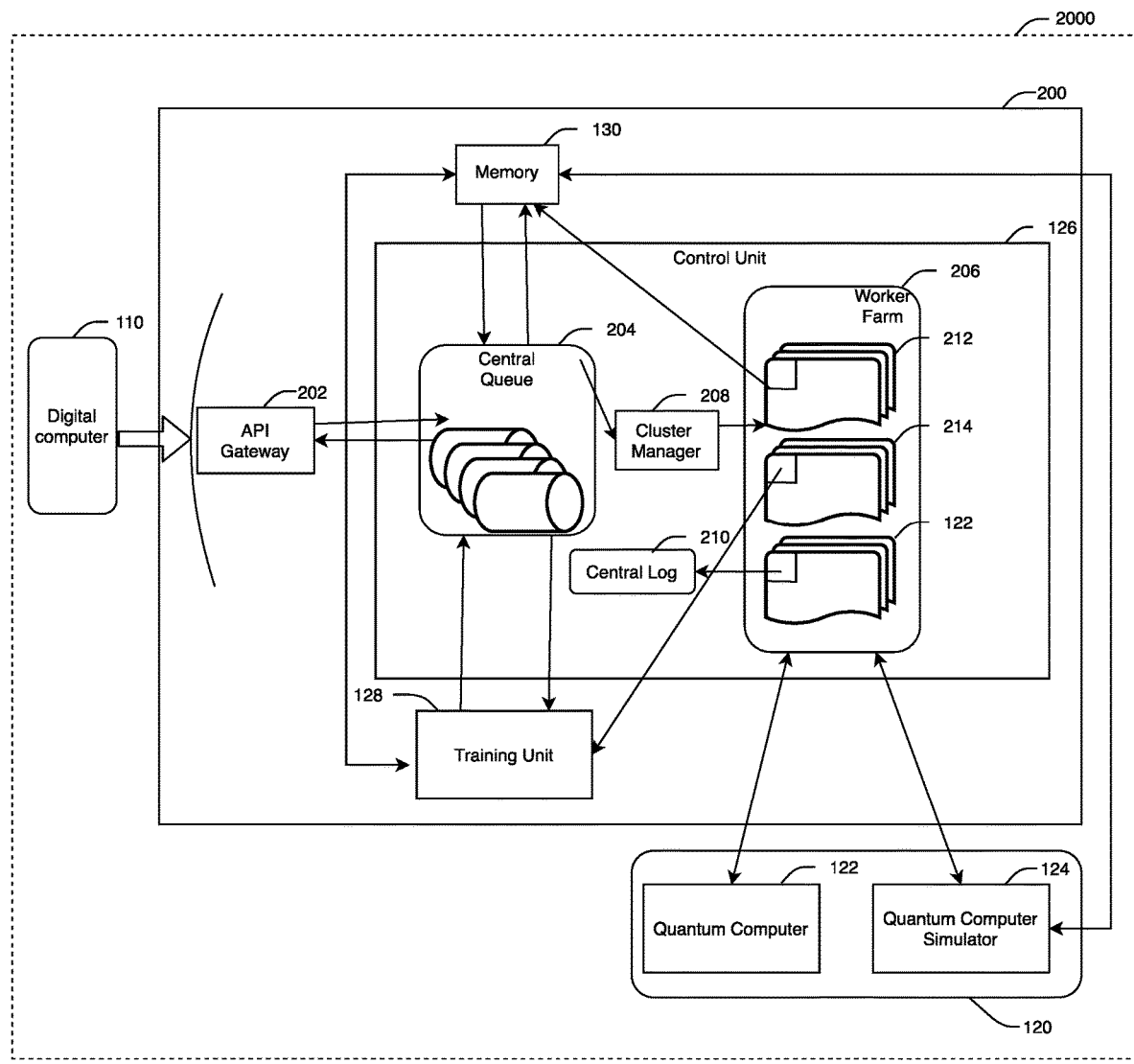
FIG. 2 is a diagram that shows another embodiment of a system for providing an access to a quantum computer and to a quantum computer simulator.

Now referring to FIG. 2, there is shown an embodiment of a system 2000. The system 2000 comprises the digital computer 110, the computing platform 120 and another embodiment of a computing system 200 used for providing an access to the computing platform 120 comprising at least one of a quantum computer and a quantum computer simulator to the digital computer 110.

It will be appreciated that the quantum computer 122 is an embodiment of a physics-inspired computer while the quantum computer simulator 124 is an embodiment of a physic-inspired computer simulator.

It will be appreciated that in this embodiment the computing system 200 comprises an API gateway 202, a memory 130, a control unit 126 and a training unit 128.

Moreover and as further explained, the control unit 126 comprises a central queue 204, a cluster manager 208, a worker farm 206 and a central log 210.

In this embodiment, a request comprising computational tasks is transmitted by a digital computer 110 to the API gateway 202. The received request is then first handled by a central queue 204 of the control unit 126 which places the received request in a queue. The skilled addressee will appreciate that the queue may have various sizes depending on the number of requests received.

A memory 130 is operatively connected to the central queue 204. In particular, the memory 130 communicates, inter alia, with the central queue 204 to record status and transactions of queues.

The central queue 204 further transmits a current state of the queue to a cluster manager 208.

It will be appreciated that the cluster manager 208 starts and controls the lifetime of certain types of computational components. More precisely, the cluster manager 208 starts at least one worker in the worker farm 206 to perform computations, such as translating to specific quantum computing instructions received and controlling digital and quantum processors to execute computational tasks.

In the embodiment shown in FIG. 2, the worker farm 206 comprises a first worker 212, a second worker 214 and a third worker 216. The skilled addressee will appreciate that the plurality of workers may comprise any number of workers. It will be appreciated that a worker completing its assigned tasks is then destroyed by the cluster manager 208 in one or more embodiments.

In the embodiment shown in FIG. 2, the central log 210 communicates with the worker farm 206 to record all events. In fact, it will be appreciated that the central log 210 is in charge of tracking the events occurring in separate task executions. Accordingly, in one or more embodiments, all the executions transmit a corresponding log of the events to the central log 210. The events are selected from a group consisting of beginning a task execution, ending of a task execution, error occurring in the course of task execution, communication interruption, etc. The skilled addressee will appreciate that various alternative embodiments may be provided for the events.

While a specific embodiment of the computing system 200 is disclosed in FIG. 2, it will be appreciated by the skilled addressee that various alternative embodiments may be possible for the computing system 200.

Figure 3:
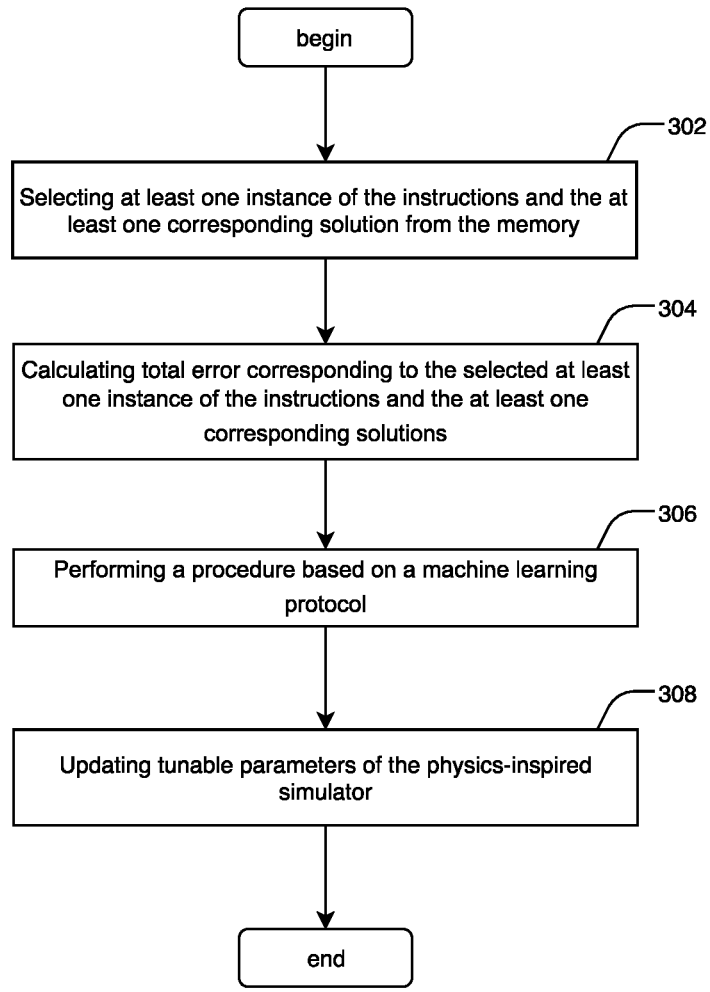
FIG. 3 is a flowchart that shows an embodiment of a method for training a physics-inspired computer simulator using a training unit to improve its performance.

Now referring to FIG. 3, there is shown an embodiment of a method for training a physics-inspired computer simulator using an optional training unit. It will be appreciated that the purpose of training the physics-inspired computer simulator is to improve its performance.

More precisely and in one or more embodiments, the method for training a physics-inspired computer simulator comprises using a machine learning training procedure.

It will be appreciated that the physics-inspired computer simulator may be any suitable physics-inspired computer simulator, such as any physics-inspired computer simulator described herein with respect to the system 100 disclosed in FIG. 1 or the system 2000 disclosed in FIG. 2.

The optional training unit may be any suitable training unit, such as any training unit described herein with respect to the computing system 118 disclosed in FIG. 1 or the training unit 128 described in the computing system 126 of FIG. 2. If a choice is made to use the at least one optional physics-inspired computer and an authorization to use the computational task for training purposes is provided, the at least one computational task and the at least one corresponding solution may be provided to the optional training unit for the purpose of training the at least one physics-inspired computer simulator. In response, the optional training unit may perform a procedure based on a machine learning protocol and update the tunable parameters of the at least one physics-inspired computer simulator. In one or more embodiments, if a choice is made to use the least one optional physics-inspired computer and an authorization to use the at least one computational task for training purposes, instructions and the at least one corresponding solution are stored in the memory.

Still referring to FIG. 3 and according to processing step 302, at least one instance of the instructions and the at least one corresponding solution are selected from the memory using the optional training unit. It will be appreciated by the skilled addressee that the selection may be based on various criteria, such as for instance, on a chronological order of the stored instances of the instructions and the at least one corresponding solutions. In one or more embodiments, the selection is based on at least one priority associated with the stored instances of the instructions and the at least one corresponding solution.

Still referring to FIG. 3 and according to processing step 304, a total error corresponding to the selected at least one instance of the instructions and the at least one corresponding solution is calculated. It will be appreciated by the skilled addressee that various embodiments may be used for calculating the total error. In one or more embodiments, the total error calculation is based on mean squared error. In one or more alternative embodiments, the total error calculation is based on cross entropy. In one or more alternative embodiments, the total error calculation is based on mean absolute error. It will be further appreciated that the total error calculation may depend on a machine learning procedure used for training the physics-inspired computer simulator.

Still referring to FIG. 3 and according to processing step 306, a procedure based on a machine learning protocol is performed using the optional training unit. It will be appreciated that the machine learning protocol may be of various types. In one or more embodiments, the machine learning protocol is a member selected from a group consisting of supervised learning, unsupervised learning and reinforcement learning. In one or more embodiments, the procedure comprises backpropagation. It will be appreciated that the procedure may comprise calculating derivatives with respect to the tunable parameters. The procedure may further comprise at least one member selected from a group consisting of batch gradient descent, stochastic gradient descent and mini-batch gradient descent. It will be appreciated by the skilled addressee that the procedure may comprise any optimization method.

Still referring to FIG. 3 and according to processing step 308, the tunable parameters of the physics-inspired simulator are updated using the optional training unit. It will be appreciated that the tunable parameters comprise weights of a neural network in one or more embodiments. It will be further appreciated that the neural network may comprise at least one member selected from a group consisting of Restricted Boltzmann Machine, Deep Boltzmann Machine, Feed Forward Neural Network and Recurrent Neural Network.

The updating may be performed in accordance with various embodiments. For instance and in one or more embodiments, the optional training unit updates the physics-inspired computer simulator tunable parameters directly. In one or more other embodiments, the optional training unit updates physics-inspired computer simulator tunable parameters that are stored in the memory and the physics-inspired computer simulator then accesses and reads the updated values stored in the memory. The skilled addressee will appreciate that various alternative embodiments may be provided for updating the physics-inspired computer simulator tunable parameters.

Figure 4:
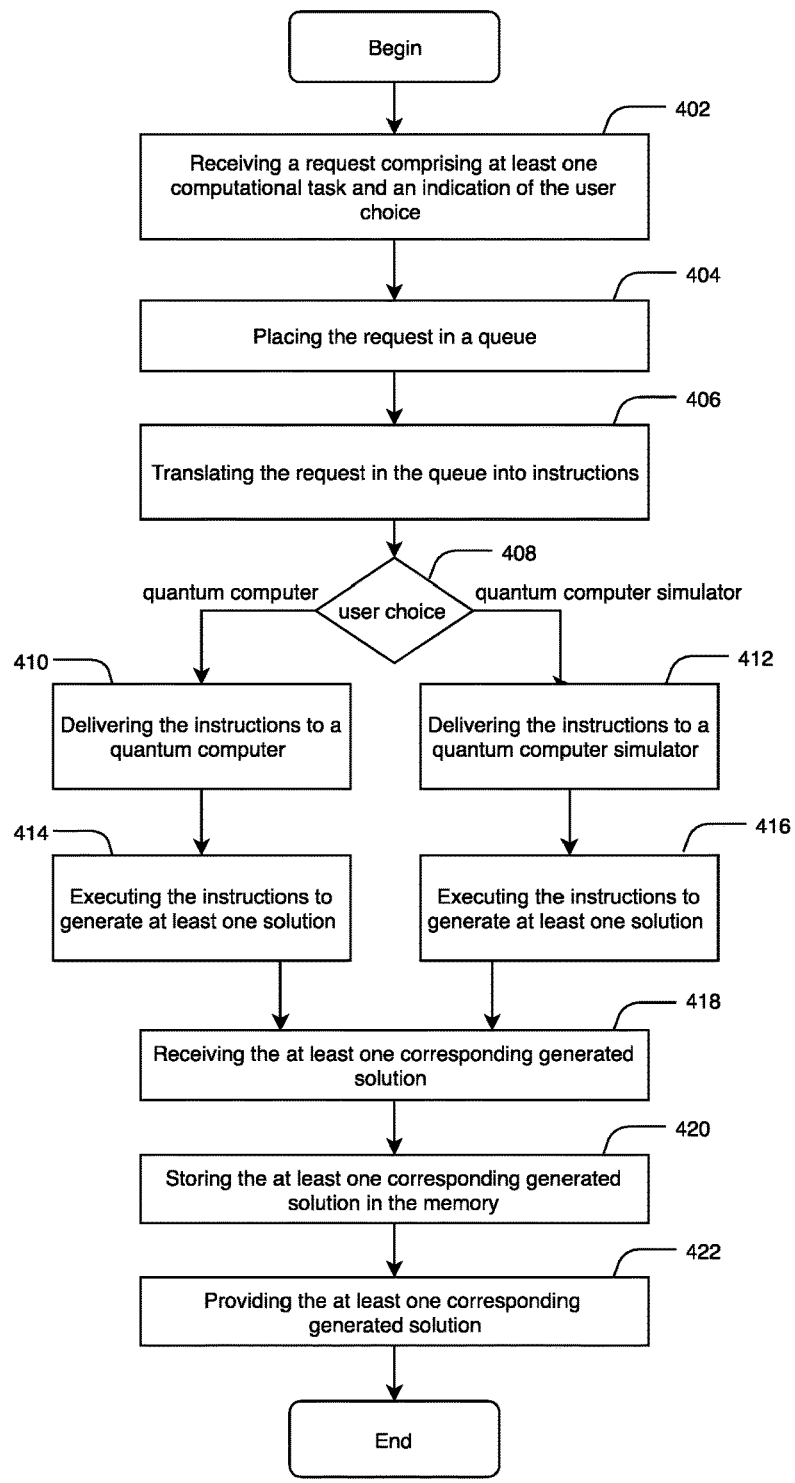
FIG. 4 is a flowchart that shows an embodiment of a method for enabling a remote access to a physics-inspired computer simulator and to a physics-inspired computer.

Now referring to FIG. 4, there is shown an embodiment of a method for enabling a remote access to a physics-inspired computing resources and simulation thereof. In one or more embodiments, the physics-inspired computing resources comprise at least one optional physics-inspired computer. It will be appreciated that the optional physics-inspired computer may be any suitable physics-inspired computer, such as any physics-inspired computer described herein with respect to the system 100 disclosed in FIG. 1 or the system 2000 disclosed in FIG. 2. In one or more embodiments, the optional physics-inspired computer comprises a quantum computer. The quantum computer may be any suitable quantum computer, such as any quantum computer described herein with respect to the system 100 disclosed in FIG. 1 or the system 2000 disclosed in FIG. 2.

Accordingly, while a quantum computer and a quantum computer simulator are further disclosed in FIG. 4 it should be understood that more generally the method disclosed in FIG. 4 enables a remote access to a physics-inspired computer, an example of which is the quantum computer and a physics-inspired computer simulator, an example of which is the quantum computer simulator.

Still referring to FIG. 4 and according to the processing step 402, a request comprising at least one computational task and an indication of a choice of at least one of the physics-inspired computer and the at least one physics-inspired computer simulator to use for processing the at least one computational task is received.

It will be appreciated that the request may be received according to various embodiments. In one or more embodiments, the request is received by a communications interface of a computing system via a data network. In one or more embodiments, the request is transmitted by a digital computer operatively connected to the communications interface via the data network.

It will be appreciated that the digital computer may be any suitable digital computer, such as any digital computer described herein with respect to the system 100 disclosed in FIG. 1 or the system 2000 disclosed in FIG. 2.

Moreover, it will be appreciated that the communication interface may be of various types. In one or more embodiments, the communications interface comprises an API gateway. The selection is for at least one of the at least one optional physics-inspired computer and at least one physics-inspired computer simulator. It will be appreciated that in one or more embodiments, the request further comprises an indication that the at least one corresponding generated solution to the at least one corresponding computational task is useable for training purposes. More precisely and as further explained below, the at least one corresponding generated solution and the at least one corresponding computational task may then be used for training the at least one physics-inspired computer simulator.

It will be appreciated by the skilled addressee that the at least one computational task may be of various types. In one or more embodiments, the at least one computational task comprises an optimization task. In one or more alternative embodiments, the at least one computational task comprises sampling from a probability distribution. In one or more alternative embodiments, the at least one computational task comprises any member of a group consisting of database search, solving Deutsch-Jozsa problem, solving quantum chemistry-related problems and integer factorization.

Still referring to FIG. 4 and according to processing step 404, the received request is placed in a queue. In one or more embodiments, the received request is placed in a queue using a queuing unit located in the computing system. It will be appreciated that this processing step is optional.

Still referring to FIG. 4 and according to processing step 406, the received request is translated. It will be appreciated that the received request may be placed in a queue or not depending on whether processing step 404 is performed or not. In fact, it will be appreciated that the received request is translated into instructions suitable for at least one of a quantum computer and a quantum computer simulator.

In one or more embodiments, the translation is performed using the control unit of the computing system. It will be appreciated that various alternative embodiments may be provided for translating the received request. It will be appreciated that the quantum computer simulator may be any suitable quantum computer simulator, such as any quantum computer simulator described herein with respect to the system 100 disclosed in FIG. 1 or the system 2000 disclosed in FIG. 2.

Still referring to FIG. 4 and according to processing step 408, a decision is made. It will be appreciated that the purpose of the decision is to decide whether the quantum computer or the quantum computer simulator should be used for executing the instructions. It will be appreciated that the decision may be made according to various embodiments. In one or more embodiments, the decision is made based on a user choice. In one or more alternative embodiments, the decision is made based on various other considerations.

In the case where the decision is that the quantum computer should be used for executing the instructions and according to processing step 410, the instructions are delivered to the quantum computer. It will be appreciated that the instructions may be delivered to the quantum computer according to various embodiments known to the skilled addressee.

According to processing step 414, the instructions are executed using the quantum computer and at least one corresponding solution resulting from an execution of the instructions is generated.

In the case where the decision is that the quantum computer simulator should be used for executing the instructions and according to processing step 412, the instructions are delivered to the quantum computer simulator. It will be appreciated that the instructions may be delivered to the quantum computer simulator according to various embodiments known to the skilled addressee.

According to processing step 416, the instructions are then executed using the quantum computer simulator and at least one corresponding solution resulting from an execution of the instructions is generated.

Still referring to FIG. 4 and according to processing step 418, the at least one corresponding generated solution resulting from an execution of the instructions is received. In one or more embodiments, the at least one corresponding generated solution is received using the control unit of the computing system.

According to processing step 420, the at least one corresponding generated solution is stored in a memory. In one or more embodiments, the at least one corresponding generated solution is stored in the memory of the computing system by the control unit.

Still referring to FIG. 4 and according to processing step 422, the at least one corresponding generated solution is provided to the digital computer. In one or more embodiments, the at least one corresponding generated solution is provided to the digital computer over the data network.

It will be appreciated that processing steps 420 and 422 are an embodiment of providing the at least one corresponding generated solution.

It will be appreciated that in the embodiment wherein the at least one corresponding generated solution is obtained from the at least one quantum computer, the method may further comprise training the quantum computer simulator using the at least one corresponding generated solution and the at least one computational task.

Moreover, it will be appreciated that in one or more embodiments, the training is performed if the request comprises an indication that the at least one computational task and the at least one corresponding generated solution are useable for training purposes.

In one or more embodiments, the training comprises performing a procedure based on a machine learning protocol using the at least one corresponding generated solution and the at least one computational task; and updating the tunable parameters of the quantum computer simulator accordingly.

Figure 5:
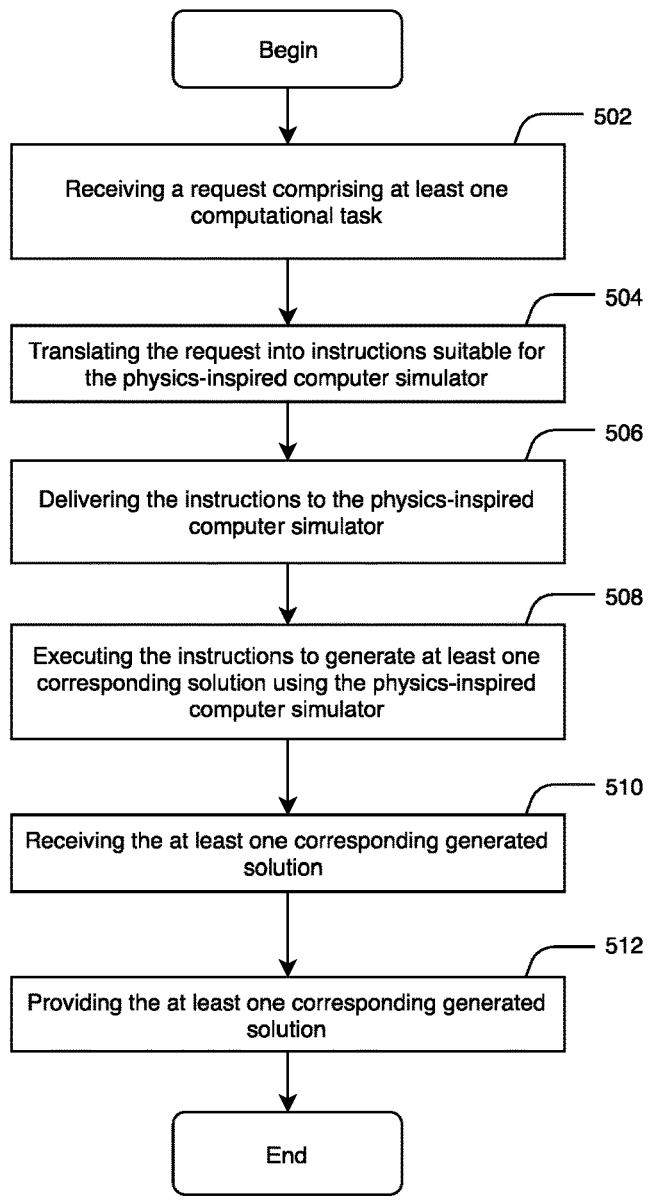
FIG. 5 is a flowchart that shows an embodiment of a method for enabling a remote access to a computing platform comprising at least one physics-inspired computer simulator.

Now referring to FIG. 5, there is shown an embodiment of a flowchart that shows an embodiment of a method for enabling a remote access to a computing platform comprising at least one physics-inspired computer simulator comprising tunable parameters. More precisely, FIG. 5 describes a method for using a physics-inspired computer simulator over a data network.

It will be appreciated that the physics-inspired computer simulator may be any suitable physics-inspired computer, such as any physics-inspired computer described herein with respect to the system 100 disclosed in FIG. 1 or the system 2000 disclosed in FIG. 2. The physics-inspired computer simulator parameters are stored in the memory in one or more embodiments.

According to processing step 502, a request comprising at least one computational task is received.

It will be appreciated that the request may be received according to various embodiments. In one or more embodiments, the request is received by a communications interface of a computing system via a data network. In one or more embodiments, the request is transmitted by a digital computer operatively connected to the communications interface via the data network.

It will be appreciated that the digital computer may be any suitable digital computer, such as any digital computer described herein with respect to the system 100 disclosed in FIG. 1 or the system 2000 disclosed in FIG. 2.

Still referring to FIG. 5 and according to processing step 504, the received request is translated. In fact, it will be appreciated that the received request is translated into instructions suitable for the at least one physics-inspired computer simulator.

In one or more embodiments, the translation is performed using the control unit of the computing system. It will be appreciated that various alternative embodiments may be provided for translating the received request.

Still referring to FIG. 5 and according to processing step 506, the instructions are delivered to the at least one physics-inspired computer simulator.

In one or more embodiments, the instructions are delivered to the at least one physics-inspired computer simulator using the control unit. In one or more embodiments, the instructions are stored in the memory.

Still referring to FIG. 5 and according to processing step 508, the instructions are executed using the at least one physics-inspired computer simulator and at least one corresponding solution is generated by the physics-inspired computer simulator.

Still referring to FIG. 5 and according to processing step 510, the at least one corresponding generated solution is received.

It will be appreciated that the at least one corresponding generated solution may be received according to various embodiments. In one or more embodiments, the at least one corresponding generated solution is received using the control unit of the computing system. In one or more embodiments, the at least one corresponding generated solution is stored in the memory.

Still referring to FIG. 5 and according to processing step 512, the at least one corresponding generated solution is provided to the digital computer.

It will be appreciated that the at least one corresponding generated solution may be provided to the digital computer according to various embodiments. In one or more embodiments, the at least one corresponding generated solution is provided to the digital computer using the communications interface of the computing system and a data network.

It will be appreciated that one or more embodiments of the method and the computing system disclosed herein are of great advantage for various reasons.

More precisely, an advantage of one or more embodiments of the method and the computing system disclosed herein is that they enable an access to a physics-inspired computer simulator trained using real computational tasks, such as a quantum device simulator, which is relatively cheaper than access to the quantum device.

Another advantage of one or more embodiments of the method and the computing system disclosed herein is that they enable to mimic a physics-inspired computer, such as a quantum computer.

Another advantage of one or more embodiments of the method and computing system disclosed herein is that they enable the use of computational tasks provided by a user to improve the physics-inspired computer simulator.

The invention claimed is:

1. A computing system for enabling remote computing over a network, said computing system comprising:
   (a) a machine learning (ML)-based simulator of a non-digital computer, wherein said ML-based simulator comprises a set of tunable parameters;
   (b) a communications interface for receiving a request provided by a processing device within said network, wherein said request comprises at least one computational task to be processed using said ML-based simulator;
   (c) a control unit operatively connected to said communications interface and said ML-based simulator, wherein said control unit is configured to (1) translate said received request into a set of executable instructions for said ML-based simulator, and (2) deliver said set of executable instructions to said ML-based simulator, and wherein in response to said set of executable instructions said ML-based simulator is configured to (i) perform said at least one computational task and (ii) generate at least one solution; and
   (d) a memory operatively connected to said control unit and said ML-based simulator, wherein said memory is configured to store said at least one computational task, a dataset contained in said received request, said set of tunable parameters of said ML-based simulator, and said at least one solution generated by said ML-based simulator.

2. The computing system of claim 1, wherein said computing system further comprises said non-digital computer; wherein said request comprises a selection for said ML-based simulator or said non-digital computer; wherein said control unit is operatively connected to said non-digital computer; wherein said control unit is configured to (1) translate said received request into a set of executable instructions for said non-digital computer and (2) deliver said set of executable instructions to said non-digital computer to perform said at least one computational task; and wherein said control unit is configured to receive, from said non-digital computer, at least one solution generated by said non-digital computer.

3. The computing system of claim 2, further comprising a training unit operatively connected to said ML-based simulator, wherein said training unit is configured to train said ML-based simulator.

4. The computing system of claim 3, wherein a type of said ML-based simulator corresponds to said non-digital computer; wherein said training unit is configured to train said ML-based simulator using at least said set of executable instructions delivered to said non-digital computer and use said at least one solution obtained from said non-digital computer.

5. The computing system of claim 4, wherein, if said request comprises an indication that said at least one computational task and at least one solution are useable for training purposes, then said training unit is configured to train said ML-based simulator using said set of executable instructions delivered to said non-digital computer and said at least one solution obtained from said non-digital computer.

6. The computing system of claim 2, wherein said set of executable instructions for said non-digital computer and said set of executable instructions for said ML-based simulator are identical.

7. The computing system of claim 2, wherein said ML-based simulator is configured to:
(i) mimic a non-digital computer output for a given input, and
(ii) update at least one of said set of tunable parameters using said training unit to thereby improve a corresponding performance of said ML-based simulator.

8. The computing system of claim 1, further comprising a training unit operatively connected to said ML-based simulator, wherein said training unit is configured to train said ML-based simulator.

9. The computing system of claim 8, wherein said training unit is selected from the group consisting of a tensor processing unit (TPU), a graphical processing unit (GPU), a field-programmable gate array (FPGA), and an application-specific integrated circuit (ASIC).

10. The computing system of claim 1, wherein said communications interface is configured to receive a plurality of requests comprising said request, and wherein said computing system comprises a queueing unit configured to queue said plurality of requests according to a criterion.

11. The computing system of claim 1, wherein said processing device within said network comprises a digital computer operatively connected to said communications interface via said network.

12. The computing system of claim 1, wherein said computing system is a distributed computing system.

13. The computing system of claim 1, wherein said non-digital computer comprises a non-classical computer.

14. The computer system of claim 13, wherein said non-classical computer is selected from the group consisting of a noisy intermediate-scale quantum (NISQ) device, a quantum computer, a superconducting quantum computer, a trapped ion quantum computer, a quantum annealer, an optical quantum computer, a spin-based quantum dot computer, and a photonics-based quantum computer.

15. The computing system of claim 1, wherein said at ML-based simulator comprises a neural network.

16. The computing system of claim 1, wherein said ML-based simulator is based on a ML learning protocol selected from the group consisting of supervised learning, unsupervised learning and reinforcement learning.

17. The computing system of claim 1, wherein said ML-based simulator comprises a generative ML model.

18. A computer-implemented method for enabling remote computing over a network, said method comprising:
(a) providing a machine learning (ML)-based simulator of a non-digital computer, wherein said ML-based simulator comprises a set of tunable parameters;
(b) receiving a request, at a communications interface, said request comprising at least one computational task to be processed using said ML-based simulator;
(c) translating said at least one computational task of said request into a set of executable instructions suitable for said ML-based simulator;
(d) providing said set of executable instructions to said ML-based simulator;
(e) receiving at least one generated solution resulting from an execution of said set of executable instructions in (d); and
(f) providing said at least one generated solution.

19. The computer-implemented method of claim 18, further comprising:
(i) providing said non-digital computer and a training unit for training said ML-based simulator;
(ii) providing, within said request, an indication of a choice of at least one of said non-digital computer or said ML-based simulator to use for processing said at least one computational task;
(iii) translating said at least one computational task of said request into a set of executable instructions suitable for at least one of said non-digital computer or said ML-based simulator; and
(iv) providing said set of executable instructions to at least one of said non-digital computer or said ML-based simulator depending on said indication of said choice.

20. The computer-implemented method of claim 19, wherein, in (b), said at least one generated solution is obtained from said non-digital computer, and wherein the method further comprises training said ML-based simulator using said at least one generated solution and said at least one computational task.

21. The computer-implemented method of claim 20, wherein, if said request comprises an indication that said at least one computational task and said at least one generated solution are useable for training purposes, said training said ML-Based simulator is performed using said at least one computational task and said at least one generated solution.

22. The computer-implemented method of claim 20, wherein said training comprises:
(i) performing a procedure based on a machine learning protocol using said at least one generated solution and said at least one computational task; and
(ii) updating said set of tunable parameters of said ML-based simulator.

23. The computer-implemented method of claim 18, wherein said request is received from a digital computer operatively connected to said communications interface using a data network; further wherein said at least one generated solution is provided to said digital computer.

24. The computer-implemented method of claim 18, further comprising storing said set of executable instructions and said at least one generated solution.

* * * * *